United States Patent
Pease et al.

(10) Patent No.: US 12,040,605 B2
(45) Date of Patent: Jul. 16, 2024

(54) VOLTAGE TRANSIENT DETECTOR AND CURRENT TRANSIENT DETECTOR

(71) Applicant: Lam Research Corporation, Fremont, CA (US)

(72) Inventors: John Pease, San Mateo, CA (US); John Drewery, San Jose, CA (US)

(73) Assignee: Lam Research Corporation, Fremont, CA (US)

( * ) Notice: Subject to any disclaimer, the term of this patent is extended or adjusted under 35 U.S.C. 154(b) by 26 days.

(21) Appl. No.: 18/011,188

(22) PCT Filed: Sep. 29, 2021

(86) PCT No.: PCT/US2021/052643
§ 371 (c)(1),
(2) Date: Dec. 18, 2022

(87) PCT Pub. No.: WO2022/072489
PCT Pub. Date: Apr. 7, 2022

(65) Prior Publication Data
US 2023/0246433 A1 Aug. 3, 2023

Related U.S. Application Data

(60) Provisional application No. 63/087,121, filed on Oct. 2, 2020.

(51) Int. Cl.
*H02H 3/04* (2006.01)
*H02H 1/00* (2006.01)
*H02H 3/20* (2006.01)

(52) U.S. Cl.
CPC .......... *H02H 1/0023* (2013.01); *H02H 3/046* (2013.01); *H02H 3/202* (2013.01)

(58) Field of Classification Search
CPC ....... H02H 1/0023; H02H 3/046; H02H 3/202
See application file for complete search history.

(56) References Cited

U.S. PATENT DOCUMENTS

| | | | | |
|---|---|---|---|---|
| 5,153,806 A | * | 10/1992 | Corey | H02H 9/042 |
| | | | | 361/127 |
| 5,914,662 A | * | 6/1999 | Burleigh | H02H 9/042 |
| | | | | 361/111 |

(Continued)

FOREIGN PATENT DOCUMENTS

| JP | 08005693 A | 1/1996 |
|---|---|---|
| JP | 08015337 A | 1/1996 |

(Continued)

OTHER PUBLICATIONS

PCT/US2021/052643, International Search Report and Written Opinion, mailed on Jan. 27, 2022.

*Primary Examiner* — Scott Bauer
(74) *Attorney, Agent, or Firm* — Penilla IP, APC

(57) ABSTRACT

A voltage transient detector includes circuitry for transmitting electrical current through a light emitting diode and a fuse that is serially connected between the light emitting diode and a reference potential, such that the light emitting diode is illuminated when the fuse is not blown. The voltage transient detector also includes circuitry for transmitting a controlled amount of electrical current through the fuse in conjunction with an occurrence of a voltage transient at a voltage measurement location, where the voltage transient exceeds a set transient threshold voltage. The controlled amount of electrical current transmitted through the fuse causing the fuse to blow and the light emitting diode to turn off, thereby indicating occurrence of the voltage transient at the voltage measurement location.

23 Claims, 14 Drawing Sheets

(56) References Cited

U.S. PATENT DOCUMENTS

| | | | | |
|---|---|---|---|---|
| 6,055,147 | A * | 4/2000 | Jeffries | H01C 7/13 |
| | | | | 361/103 |
| 10,366,979 | B2 * | 7/2019 | Reinprecht | H01L 27/0285 |
| 2011/0304940 | A1 * | 12/2011 | Cao | H01L 23/60 |
| | | | | 361/56 |
| 2016/0134103 | A1 * | 5/2016 | Namizaki | H02H 9/04 |
| | | | | 361/56 |
| 2019/0086450 | A1 | 3/2019 | Cocchini et al. | |

FOREIGN PATENT DOCUMENTS

| | | |
|---|---|---|
| JP | 11103246 A | 4/1999 |
| JP | 2002257872 A | 9/2002 |

* cited by examiner

VOLTAGE TRANSIENT DETECTOR AND CURRENT TRANSIENT DETECTOR

This application is a national stage filing of and claims priority, under 35 U.S.C. § 371, to PCT/US2021/052643, filed on Sep. 29, 2021, which claims the benefit of U.S. Provisional Application No. 63/087,121, filed on Oct. 2, 2020. The entire disclosure of each application referenced above is incorporated herein by reference.

BACKGROUND

In many industrial systems, such as those associated with semiconductor fabrication, among others, in order to detect electrical transients that are infrequent, it is necessary to connect a data acquisition system to an electrical measurement device to continuously acquire large amounts of electrical measurement data over long periods of time and analyze the large amounts of electrical measurement data to determine whether or not an electrical transient occurred. This process can be prohibitively expensive and time consuming. Also, this process can require use of large and expensive equipment such as an oscilloscope, a data logger, and/or a digital electrical measurement device, among other devices, that when connected to the system under test can become problematic for operation of the system under test. Also, in some cases, information can be lost if power to the system under test and/or data acquisition system is removed. Also, the problem of detecting infrequent electrical transients is further complicated by having to use electrical wiring to route electrical signals out of enclosed equipment of the system under test. Additionally, in some cases, an electrical measurement location of interest and/or access to the electrical measurement location of interest can be located in a high electric field, such as an electric field associated with direct current power transmission, alternating current power transmission, and/or radiofrequency power transmission. The electric field can interfere with routing and transmission of electrical signals from the electrical measurement location. Therefore, a solution is needed to detect infrequent electrical transients that is compact, inexpensive, and immune to electrical noise. It is within this context that the present disclosure arises.

SUMMARY

In an example embodiment, a voltage transient detector is disclosed. The voltage transient detector includes a positive terminal configured for connection to a voltage measurement location. The voltage transient detector also includes a negative terminal configured for connection to a reference potential. The voltage transient detector also includes a transient indicator circuit that has an input connected to the positive terminal. The voltage transient detector also includes a transient detection storage circuit that has an input connected to an output of the transient indicator circuit. The transient detection storage circuit has an output connected to the reference potential. The voltage transient detector also includes a transient threshold voltage control circuit that has an input connected to the positive terminal. The voltage transient detector also includes a transient detection circuit that has a first input connected to a node within the transient threshold voltage control circuit. The transient detection circuit has a second input connected to an output of the transient threshold voltage control circuit. The transient detection circuit has an output connected to the input of the transient detection storage circuit.

In an example embodiment, a voltage dot is disclosed. The voltage dot includes a printed circuit board and a plurality of voltage transient detectors formed on the printed circuit board. Each of the plurality of voltage transient detectors is configured to detect transient voltages above a corresponding transient threshold voltage. The corresponding transient threshold voltage is different for different ones of the plurality of voltage transient detectors. Each of the plurality of voltage transient detectors is configured to provide a persistent indication of having detected a voltage transient that exceeds the corresponding transient threshold voltage.

In an example embodiment, a method is disclosed for detecting voltage transients. The method includes transmitting electrical current through a light emitting diode and a fuse that is serially connected between the light emitting diode and a reference potential, such that the light emitting diode is illuminated when the fuse is not blown. The method also includes transmitting a controlled amount of electrical current through the fuse in conjunction with an occurrence of a voltage transient that exceeds a transient threshold voltage. The voltage transient occurs at a voltage measurement location. The controlled amount of electrical current transmitted through the fuse causes the fuse to blow and the light emitting diode to turn off.

Other aspects and advantages of the invention will become more apparent from the following detailed description, taken in conjunction with the accompanying drawings, illustrating by way of example the present invention.

DETAILED DESCRIPTION

In the following description, numerous specific details are set forth in order to provide a thorough understanding of the present disclosure. It will be apparent, however, to one skilled in the art that embodiments of the present disclosure may be practiced without some or all of these specific details. In other instances, well known process operations have not been described in detail in order not to unnecessarily obscure the present disclosure.

Figure 1A:
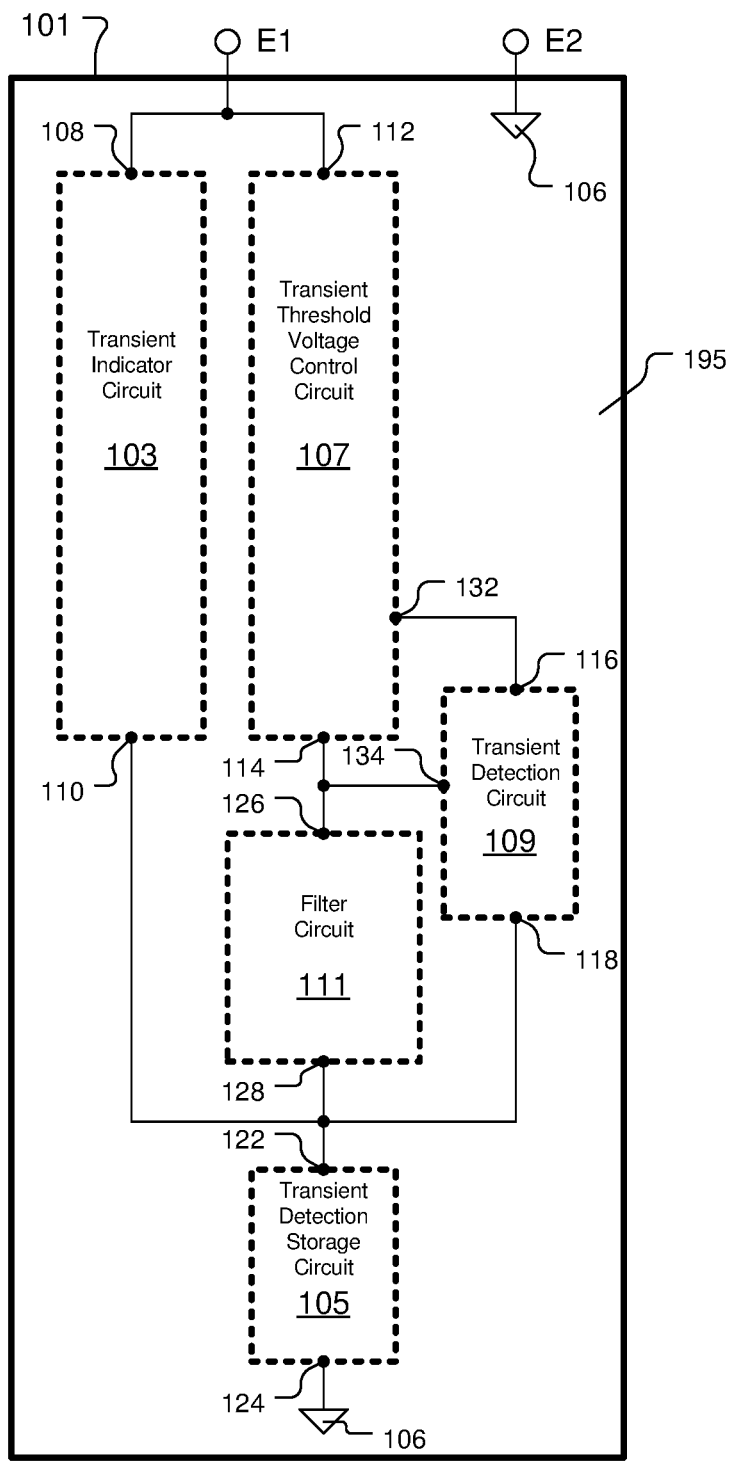
FIG. 1A shows a voltage transient detector, in accordance with some embodiments.

Systems and methods are disclosed herein for detecting a voltage transient that exceeds a set threshold voltage and for providing a persistent and reliable indication that the voltage transient occurred. FIG. 1A shows a voltage transient detector 101, in accordance with some embodiments. The voltage transient detector 101 includes a positive terminal E1 for connection to a voltage measurement location. The voltage transient detector 101 also includes a negative terminal E2 for connection to a reference potential 106. The reference potential 106 is at a lower voltage than the voltage that is to be measured at the voltage measurement location. In some embodiments, the reference potential 106 is a reference ground potential. The voltage transient detector 101 includes a transient indicator circuit 103 that has an input 108 connected to the positive terminal E1. The transient indicator circuit 103 is configured to provide a persistent indication that a voltage transient above a set transient threshold voltage has occurred at the voltage measurement location. The voltage transient detector 101 also includes a transient detection storage circuit 105 that has an input 122 connected to an output 110 of the transient indicator circuit 103. The transient detection storage circuit 105 has an output 124 connected to the reference potential 106. The transient detection storage circuit 105 is configured to enable the persistence of the indication of occurrence of the voltage transient by the transient indicator circuit 103.

The voltage transient detector 101 also includes a transient threshold voltage control circuit 107 that has an input 112 connected to the positive terminal E1. The transient threshold voltage control circuit 107 is configured to set the transient threshold voltage above which the transient indicator circuit 103 will indicate occurrence of a voltage transient at the voltage measurement location. The voltage transient detector 101 also includes a transient detection circuit 109 that has a first input 116 connected to a node 132 within the transient threshold voltage control circuit 107. The transient detection circuit 109 has a second input 134 connected to an output 114 of the transient threshold voltage control circuit 107. The transient detection circuit 109 has an output 118 connected to the input 122 of the transient detection storage circuit 105. The transient detection circuit 109 is configured to transmit a controlled amount of electrical current to the transient detection storage circuit 105 when the voltage at the voltage measurement location exceeds the transient threshold voltage as set by the transient threshold voltage control circuit 107. The controlled amount of electrical current transmitted through the transient detection circuit 109 to the transient detection storage circuit 105 causes a change in a device state within the transient detection storage circuit 105, which in turn causes the transient indicator circuit 103 to convey the persistent indication that a voltage transient has occurred at the voltage measurement location, where the voltage transient exceeds the transient threshold voltage as set by the transient threshold voltage control circuit 107. Also, in some embodiments, the voltage transient detector 101 optionally includes a filter circuit 111 that has an input 126 connected to the output 114 of the transient threshold voltage control circuit 107. The filter circuit 111 also has an output 128 connected to the input 122 of the transient detection storage circuit 105. The filter circuit 111 is configured to protect the transient detection circuit 109 from electrical noise within the vicinity of the voltage transient detector 101. In some embodiments, the voltage transient detector 101 is implemented on a printed circuit board (PCB) 195.

Figure 1B:
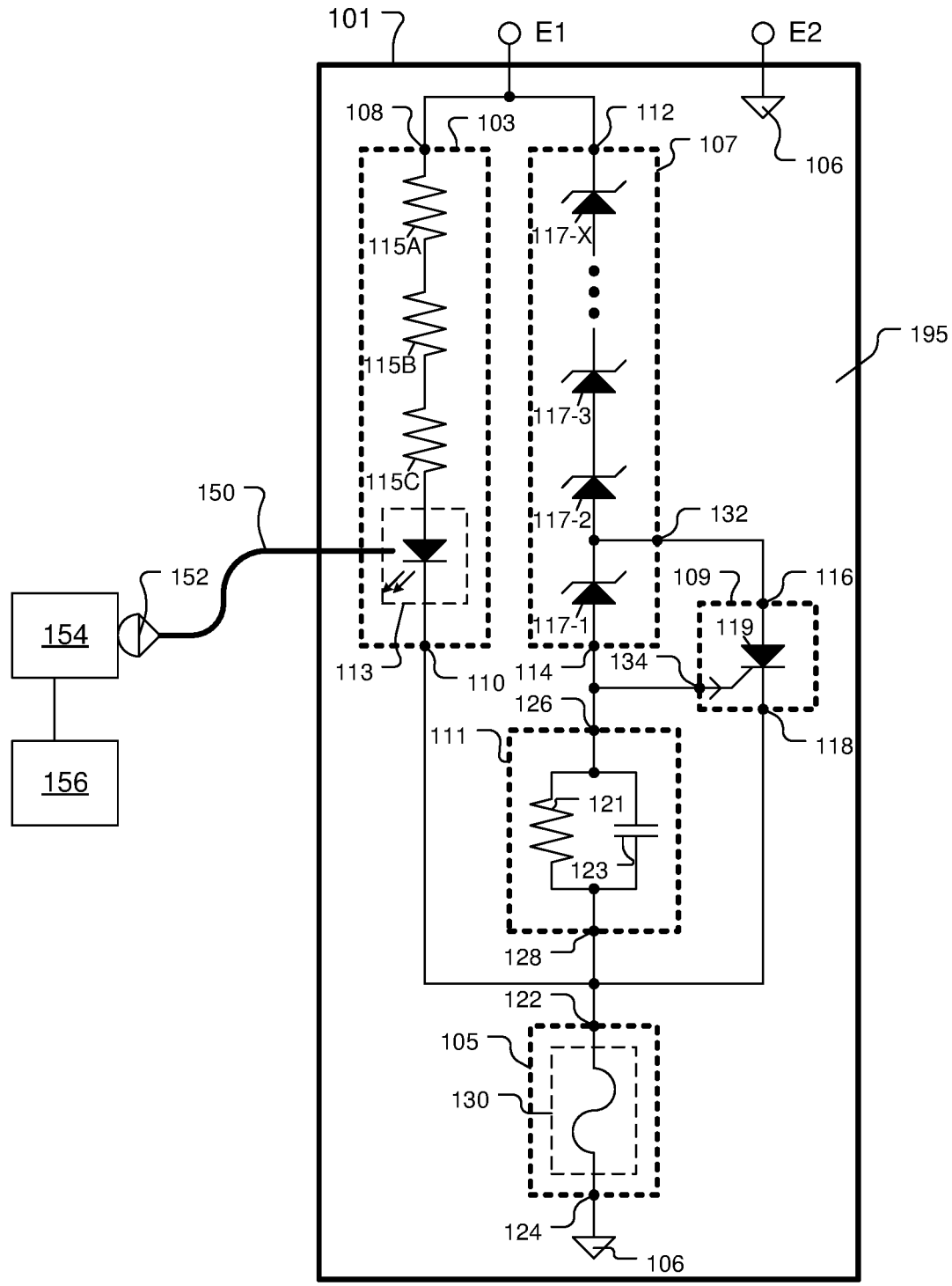
FIG. 1B shows an example implementation of the voltage transient detector, in accordance with some embodiments.

FIG. 1B shows an example implementation of the voltage transient detector 101, in accordance with some embodiments. The voltage transient detector 101 is connected between the positive terminal E1 and the negative terminal E2. The positive terminal E1 is electrically connected to the voltage measurement location. The negative terminal E2 is electrically connected to the reference potential 106. In some embodiments, the reference potential 106 is an electrical ground. In some embodiments, the reference potential 106 is a floating potential. For example, if detection of a differential voltage transient is of interest, the reference potential 106 can be a floating potential relative to the voltage to be measured at the voltage measurement location.

In the example of FIG. 1B, the transient indicator circuit 103 includes a light emitting diode (LED) 113 connected between the input 108 and the output 110 of the transient indicator circuit 103. Also, in some embodiments, one or more resistors are connected between the LED 113 and the input 108 of the transient indicator circuit 103. For example, in FIG. 1B, three resistors 115A, 115B, and 115C are serially connected between the input 108 of the transient indicator circuit 103 and the anode of the LED 113. The resistors 115A, 115B, and 115C function to limit electrical current flow to the LED 113 so that the electrical current seen by the LED 113 is within normal operating specifications for the LED 113. In some embodiments, the resistors 115A, 115B, and 115C are replaced by an electrical current source to ensure that the electrical current that flows through the LED 113 is within the normal operating specifications for the LED 113. In the example of FIG. 1B, the electrical current used to power the LED 113 is provided from the positive input terminal E1 and flows through the resistors 115A, 115B, and 115C, and through the LED 113, and through the transient detection storage circuit 105 to the reference potential 106, which is connected to the negative terminal E2. In this manner, the LED 113 will remain illuminated as long as electrical current flows from the positive input terminal E1 through the transient indicator circuit 103 and through the transient detection storage circuit 105 to the reference potential 106.

Therefore, so long as the transient detection storage circuit 105 provides electrical continuity between its input 122 and its output 124, the LED 113 will be illuminated when the positive terminal E1 is connected to an energized voltage measurement location and the negative terminal E2 is connected to the reference potential 106. In the example of FIG. 1B, the transient detection storage circuit 105 is a fuse 130. The fuse 130 is connected between a cathode of the LED 113 and the reference potential 106, which corresponds to the negative input terminal E2. The fuse 130 functions as a memory element that blows when a voltage transient as measured between the positive input terminal E1 and the negative input terminal E2 exceeds a transient threshold voltage set by the transient threshold voltage control circuit 107, thereby providing a persistent non-volatile record of the occurrence of the transient voltage. As discussed below, the transient threshold voltage control circuit 107 and the transient detection circuit 109 work together to supply enough current the transient detection storage circuit 105 to blow the fuse 130 when the voltage transient occurs. When the fuse 130 blows, the LED 113 is turned off because the electrical continuity between the cathode of the LED 113 and the reference potential 106 is broken. The LED 113 being off provides a persistent indication that a voltage transient occurred based on the transient threshold voltage set by the transient threshold voltage control circuit 107. In some embodiments, the fuse 130 is installed by soldering. In some of these embodiments, the transient detection storage circuit 105 includes multiple fuse insertion locations to enable installation of a new fuse to reset the voltage transient detector 101. There is only one intact fuse 130 installed in the transient detection storage circuit 105 at a given time. By having multiple fuse insertion locations it is possible to reduce or avoid having to re-solder a new fuse at a previously occupied fuse location on the PCB 195.

The transient threshold voltage control circuit 107 includes at least one Zener diode 117-1 to 117-X, where X is the number of Zener diodes, connected between the input 112 and the output 114 of the transient threshold voltage control circuit 107. Each Zener diode 117-1 to 117-X is configured to transmit electrical current from its cathode to its anode (backwards) when a particular Zener voltage is applied between its cathode and its anode. The particular Zener voltage needed to turn on backwards flow of electrical current through a given Zener diode can vary for different Zener diodes 117-1 to 117-X. A sum of Zener voltage(s) of the at least one Zener diode 117-1 to 117-X sets the transient threshold voltage for voltage transient detection (for over voltage fault detection). In some embodiments, X is at least two, such that the transient threshold voltage control circuit 107 includes plurality of Zener diodes 117-1 to 117-X serially connected between the input 112 and the output 114 of the transient threshold voltage control circuit 107. Again, a sum of the Zener voltages of the plurality of Zener diodes 117-1 to 117-X sets the transient threshold voltage for voltage transient detection.

In the example of FIG. 1B, the transient detection circuit 109 includes a silicon controlled rectifier (SCR) 119 that has an anode connected to the first input 116 of the transient detection circuit 109, which is connected to the node 132 within the string of Zener diodes 117-1 to 117-X, within the transient threshold voltage control circuit 107. The SCR 119 also has a cathode connected to the output 118 of the transient detection circuit 109, which is connected to the input 122 of the transient detection storage circuit 105. The SCR 119 also has a gate connected to the second input 134 of the transient detection circuit 109, which is connected to the output 114 of the transient threshold voltage control circuit 107. The node 132 to which the first input 116 of the transient detection circuit 109 is connected (to which the anode of the SCR 119 is connected) is located between an adjacent pair of serially connected Zener diodes 117-1 and 117-2 in the plurality of Zener diodes 117-1 to 117-X, within the transient threshold voltage control circuit 107. The node 132 is positioned along the string of Zener diodes 117-1 to 117-X so that a sum of the Zener voltages of Zener diodes 117-2 to 117-X between the node 132 and the input 112 of the transient threshold voltage control circuit 107 does not exceed a voltage rating of the fuse 130 within the transient detection storage circuit 105. In this manner, the voltage across the fuse 130 when the SCR 119 is turned on will not cause the fuse to adversely arc or re-heal itself. The node 132 can be positioned anywhere along the string of Zener diodes 117-1 to 117-X, so long as the sum of the Zener voltages between the node 132 and the input 112 of the transient threshold voltage control circuit 107 provides a large enough voltage drop across the fuse 130 to blow the fuse 130 and avoid adverse behavior of the fuse 130. More specifically, the node 132 is located along the string of Zener diodes 117-1 to 117-X so as to limit the amount of electrical current that flows through the fuse 130 by way of the SCR 119. This is why the input 116 of the transient detection circuitry 109 (the anode the SCR 119) is not directly connected to the positive input terminal E1 in this example.

Once the SCR 119 is turned on, the electrical current flowing through the SCR 119 is just limited by the low resistance of the SCR 119. And, the voltage drop across the SCR 119 is just limited by the voltage differential between the voltage at the positive input terminal E1 and the reference potential 106. The fuse 130 is rated for use with certain voltages and certain currents. When the fuse 130 blows, if there is too much voltage across the fuse 130 or too much current flowing through the fuse 130, the fuse 130 may re-heal itself. If this occurs, the fuse 130 will blow and then re-heal itself, thereby causing the LED 113 to turn off and then turn back on, which causes observation of the voltage transient to be missed. Therefore, the anode of the SCR 119 is connected to the node 132 location in the string of Zener diodes 117-1 to 117-X in order to limit the energy that goes through the SCR 119 to the fuse 130, while still allowing enough energy go through the SCR 119 to blow the fuse 130. In other words, because the SCR is located between a portion of the string of Zener diodes 117-2 to 117-X and the fuse 130, the portion of the string of Zener diodes 117-2 to 117-X limits the amount of the voltage that the fuse 130 is exposed to when the SCR 119 is turned on. This also allows for use of a lower voltage SCR 119, which provides more latitude in trading off different SCRs for speed ratings and/or other properties.

When a voltage transient occurs between the positive input terminal E1 and the reference potential 106 (or the negative input terminal E2) that exceeds the transient threshold voltage corresponding to the sum of Zener voltages of the Zener diodes 117-1 to 117-X, an electrical current flows through the output 114 of the transient threshold voltage control circuit 107 and through the second input 134 of the transient detection circuit 109 to the gate of the SCR 119, which causes the SCR 119 to turn on. When the SCR 119 turns on, a controlled amount of electrical current flows from the anode of the SCR 119 to the cathode of the SCR 119, such that electrical current flows from the node 132 through the input 116 of the transient detection circuit 109, through the SCR 119, through the output 118 of the transient detection circuit 109 to the input 122 of the transient detection storage circuit 105, and to the fuse 130. This controlled amount of electrical current is controlled by the sum of the Zener voltages between the node 132 and the input 112 of the transient threshold voltage control circuit 107.

The Zener diodes 117-1 to 117-X are selected to carefully control the transient threshold voltage, which is the sum of the Zener voltages of the Zener diodes 117-1 to 117-X. The transient threshold voltage is the minimum voltage difference between the positive input terminal E1 and the reference potential 106 (the negative input terminal E2) that will cause electrical current to flow into the gate of the SCR 119 to turn on the SCR 119 and thereby cause the fuse 130 to blow. Because the Zener diodes turn on very fast (on the order of picoseconds) the minimum duration of voltage transient in excess of the transient voltage threshold that can be detected by the voltage transient detector 101 (minimum voltage transient time) is dependent on the speed at which the SCR 119 can turn on. It typically takes a supply of milliamps for tens of nanoseconds at the gate of the SCR 119 to turn on the SCR 119. It is possible to obtain an SCR 119 with a trigger time (turn on time) as low as 20 to 50 nanoseconds. In some example semiconductor fabrication applications in which the voltage transient detector 101 is used, the voltage transient times are within a range extending from about one hundred nanoseconds to about several microseconds, with a transient voltage of hundreds of volts.

Once the SCR 119 is turned on, the SCR 119 will stay on until the current flowing from its anode to its cathode goes below a certain amount. Therefore, once the SCR 119 turns on, the SCR 119 stays on until there is not sufficient electrical current to continue driving the SCR 119. In the example of FIG. 1B, once the SCR 119 turns on, the SCR 119 will stay on until either the fuse 130 blows or the power supply (voltage differential between the positive input terminal E1 and the reference potential 106) goes away. Therefore, in the transient detection circuit 109, the SCR 119 functions as a type of switch that comes on strong with an initial triggering supply of electrical current at its gate, and stays on even after the initial triggering current is removed from its gate.

The example of FIG. 1B also shows implementation of the optional filter circuit 111, where the filter circuit 111 includes a resistor 121 connected between the input 126 and the output 128 of the filter circuit 111. Also, the filter circuit 111 includes a capacitor 123 connected between the input 126 and the output 128 of the filter circuit 111. In some embodiments, the resistor 121 and the capacitor 123 provide filtering of electrical noise and electrical noise immunity for the gate of the SCR 119. The resistance of the resistor 121 and the capacitance of the capacitor 123 are set to avoid interfering with the proper operation of the SCR 119.

In some embodiments, the transient detection storage circuit 105 is implemented in ways that do not utilize the fuse 130. For example, in some embodiments, the transient detection storage circuit 105 is implemented as a latching relay that uses a voltage pulse provided from the transient detection circuit 109, in accordance with the voltage differential between the positive input terminal E1 and the reference potential 106 exceeding the transient voltage threshold as set by the string of Zener diodes 117-1 to 117-X, in order to set a contact state within the latching relay that turns off the LED 113. Then, after observation of the LED 113 is completed, a reset pulse applied to a relay coil within the latching relay causes resetting of the contact state within the latching relay to enable continued use of the voltage transient detector 101.

In some embodiments, the transient detection storage circuit 105 is implemented as a liquid crystal element that uses an electric field to change its polarization and/or light transmission state from transparent to opaque. The electric field is provided by the transient detection circuitry 109. The liquid crystal element maintains its light transmission state when the electric field is removed. In some embodiments, the liquid crystal element is used to as an optical shutter to allow transmission of light from the LED 113 when the light transmission state of the liquid crystal element is transparent, and to block transmission of light from the LED 113 when the light transmission state of the liquid crystal element is opaque. In these embodiments, the output 110 of the transient indicator circuit 103 is connected directly to the reference potential 106.

In some embodiments, the transient detection storage circuit 105 is implemented as a micro-electromechanical system (MEMS) device. In these embodiments, the MEMS device is configured to store its state when a sufficiently large voltage is applied to it from the transient detection circuitry 109. In some embodiments, the transient detection storage circuit 105 is implemented as an electrically erasable programmable read-only memory (EEPROM) device or as an erasable programmable read-only memory (EPROM) device connected to deposit charge on a gate of a metal-oxide-semiconductor field-effect transistor (MOSFET) when a sufficiently large voltage is applied to the gate from the transient detection circuitry 109. With low leakage of the MOSFET, the charge on the MOSFET will remain trapped and can be read by external circuitry until erased.

In the voltage transient detector 101, the LED 113 is on when the voltage difference between the voltage at the positive input terminal E1 and the reference potential 106 (negative input terminal E2) has not exceeded the transient threshold voltage as set by the transient threshold voltage control circuit 107. In some embodiments, an optical fiber 150 is used to convey the light emitted by the LED 113 to a remote monitoring location away from the voltage measurement location. The optical fiber 150 has a first end positioned to couple in light emitted by the LED 113. The optical fiber 150 has a second end positioned at the remote monitoring location away from the voltage measurement location. In some embodiments, a lens 152 is optically coupled to the second end of the optical fiber 150. The lens 152 is configured to display light transmitted through the second end of the optical fiber 150. In some embodiments, a photodetector 154 is optically coupled to the second end of the optical fiber 150 or to the lens 152. The photodetector 154 is configured to detect light transmitted through the second end of the optical fiber 150 and generate an electrical signal indicative of the detected light. A data acquisition device 156 is connected to receive the electrical signal from the photodetector 154. The data acquisition device 156 is configured to record data that memorializes when a change occurs in the electrical signal received from the photodetector device 154, thereby indicating a change in the state of the LED 113 from on to off. In some embodiments, the data acquisition device 156 is set to log the state of the light emanating from the second end of the optical fiber 150 as detected by the photodetector 154 at a set time interval, such as every one-half second, by way of example, in order to determine when the LED 113 turns off, and correspondingly when the voltage transient occurs at the voltage measurement location.

In the example of FIG. 1B, the voltage transient detector 101 uses the series of Zener diodes 117-1 to 117-X to trigger the SCR 119, when the combined Zener voltages of the series of Zener diodes 117-1 to 117-X is exceeded. When the SCR 119 is triggered, the SCR 119 imparts a surge of electrical current through the fuse 130, such that the fuse 130 blows and the series connected LED 113 turns off, where the LED 113 was previously on by way of the intact (not blown) fuse 130. Because the fuse 130 blew, the information about the minimum magnitude of the voltage transient that occurred at the voltage measurement location is now permanently stored, where the minimum magnitude of the voltage transient is know from the sum of the Zener voltages of the series of Zener diodes 117-1 to 117-X. Also, the light emitted by the LED 113 can be conveyed through the optical fiber 150 to a remote monitoring location away (possibly several meters) from the voltage measurement location for easy viewing by a person or by the photodetector 154.

The voltage transient detector 101 uses very little power from the system under test and its voltage transient detection speed is limited only by the rate at which the SCR 119 can turn on and deliver the surge of electrical current to the fuse 130. Also, by way of connection of the node 132 to a location along the string of Zener diodes 117-1 to 117-X, the voltage transient detector 101 includes an automatic current limit that prevents the fuse 130 from burning or exploding. The fuse 130 can be easily replaced to enable further use of the voltage transient detector 101. Also, the voltage transient detector 101 can work with either voltage polarity as long as the positive input terminal E1 is positive with respect to the negative input terminal E2. Also, in some embodiments, the reference potential 106 can be connected to a floating potential by way of the negative input terminal E2 in order to have the voltage transient detector 101 operate in a windowed voltage mode so as to detect when a voltage transient exceeds a certain voltage differential. Also, in some embodiments, the voltage transient detector 101 has a small size on the order of about 6 square inches when implemented on the PCB 195. Therefore, the voltage transient detector 101 can be installed in a very tight space, and the optical fiber 150 can be routed out of the very tight space to a convenient and safe location for monitoring of the LED 113. It should be appreciated that the voltage transient detector 101 provides a persistent indication of the occurrence of a voltage transient that exceeds a set transient threshold voltage. The voltage transient detector 101 also has a small size, has a fast detection response capability, and draws very little power from the system under test.

Figure 2:
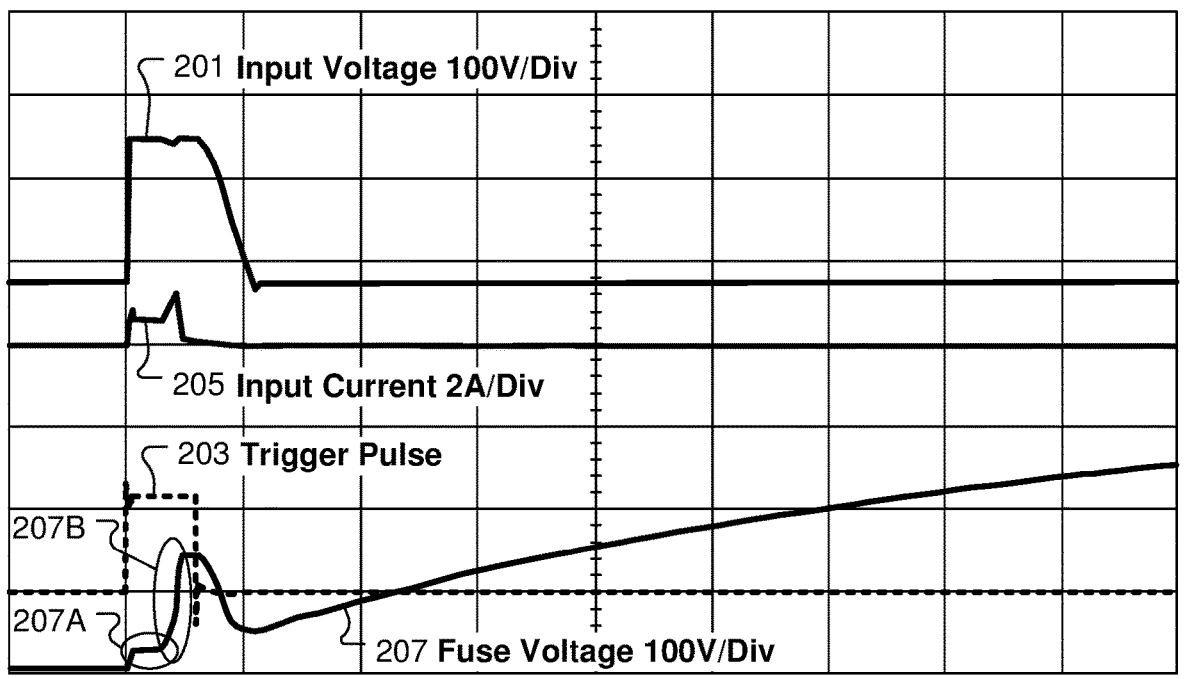
FIG. 2 shows plots of voltage and current as a function of time demonstrating operation of the voltage transient detector, in accordance with some embodiments.

FIG. 2 shows plots of voltage and current as a function of time demonstrating operation of the voltage transient detector 101, in accordance with some embodiments. A curve 201 shows a voltage transient applied to the positive input terminal E1 relative to the reference potential 106 (relative to the negative input terminal E2). For the curve 201, each vertical division of the chart represents 100 V. Also, for all curves shown in FIG. 2, each horizontal division of the chart represents one microsecond. So, the voltage transient applied to the positive input terminal E1 is about 900 V and lasts for about 3 microseconds before falling off. A curve 203 shows the voltage applied to the gate of the SCR 119 relative to the reference potential 106 (relative to the negative input terminal E2) in response to the voltage transient represented by the curve 201. For the curve 203, each vertical division of the chart represents 100 V. The curve 203 shows that the voltage is applied to the gate of the SCR 119 from the output 114 of the transient threshold voltage control circuit 107 when the voltage transient exceeds the transient threshold voltage set by the string of Zener diodes 117-1 to 117-X within the transient threshold voltage control circuit 107. A curve 205 shows the electrical current flowing through the SCR 119 from the node 132 to the input 122 of the transient detection storage circuit 105 (to the input of the fuse 130). For the curve 205, each vertical division of the chart represents two amperes. Comparison of the curves 205 and 203 shows that as soon as electrical current is applied to the gate of the SCR 119, the SCR 119 turns on. A curve 207 shows voltage across the fuse 130 as a function of time relative to the reference potential 106 (relative to the negative input terminal E2). For the curve 207, each vertical division of the chart represents 100 V. The curve 207 includes a flat region 207A during which the fuse 130 is melting in conjunction with the electrical current flowing through it as shown by the curve 205. The curve 207 also shows a voltage excursion region 207B that corresponds to the fuse 130 blowing with formation of a normal electrical arc. When the fuse 130 blows at the region 207B, the electrical current flowing through the SCR 119 drops to zero as shown by the curve 205. The blown fuse 130 provides a persistent and unchangeable record of the occurrence of the voltage transient that exceeded the transient threshold voltage. Also, in conjunction with the fuse 130 blowing, the LED 113 turns off because the blown fuse 130 interrupts the power circuit of the LED 113. Therefore, the LED 113 being off indicates that the fuse 130 is blown, which indicates occurrence of the voltage transient that exceeded the transient threshold voltage as set by the sum of Zener voltages in the string of Zener diodes 117-1 to 117-X within the transient threshold voltage control circuit 107.

Figure 3:
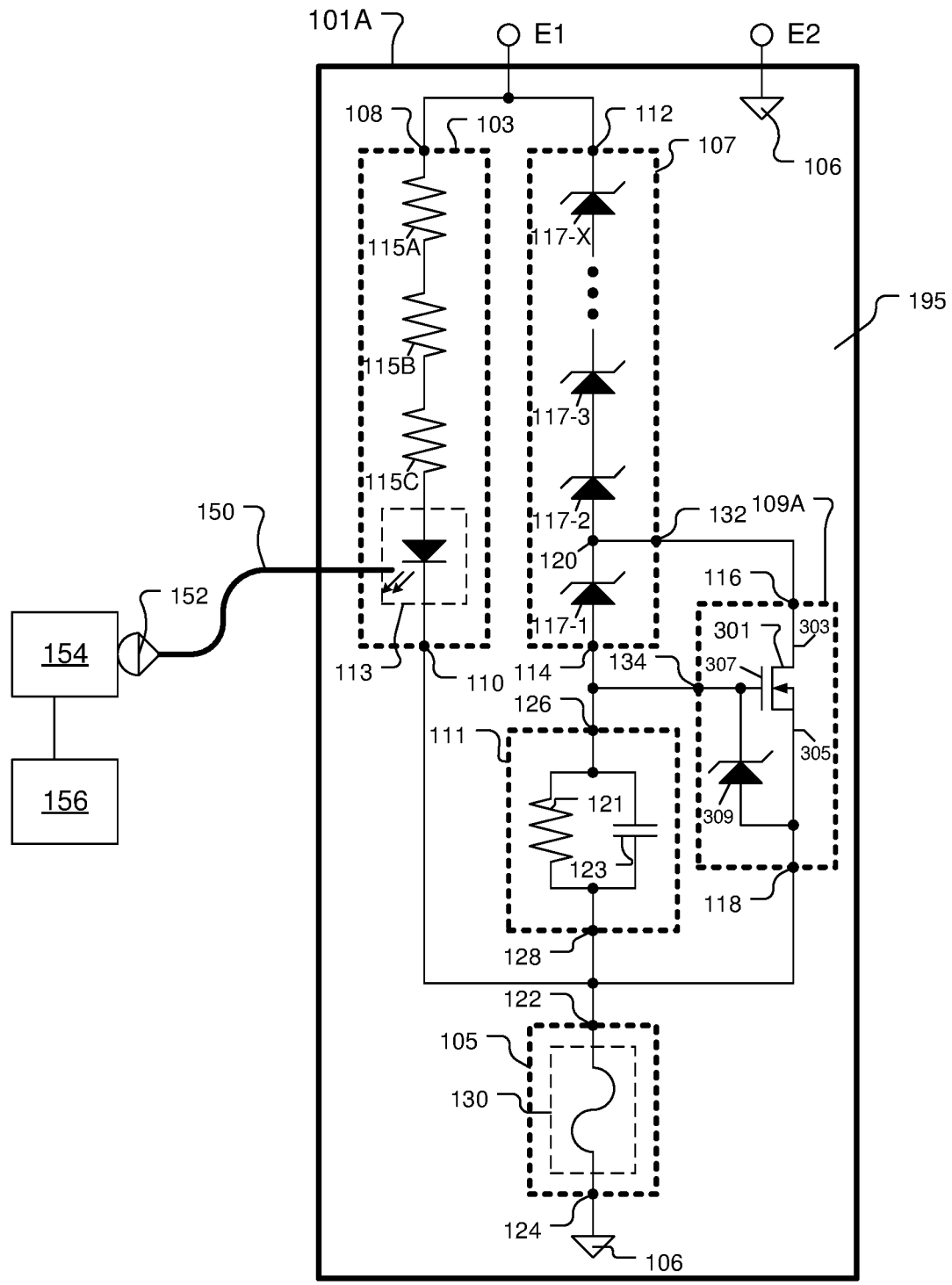
FIG. 3 shows a modified voltage transient detector in which a transient detection circuit includes a MOSFET instead of the SCR, in accordance with some embodiments.

FIG. 3 shows a modified voltage transient detector 101A in which a transient detection circuit 109A includes a metal-oxide-semiconductor field-effect transistor (MOSFET) 301 instead of the SCR 119, in accordance with some embodiments. Other than the transient detection circuit 109A, all other components of the modified voltage transient detector 101A are the same as described with regard to the voltage transient detector 101 of FIG. 1B. The MOSFET 301 has a drain 303 connected to the first input 116 of the transient detection circuit 109, which is connected to the node 132 within the transient threshold voltage control circuit 107. The MOSFET 301 also includes a source 305 connected to the output 118 of the transient detection circuit 109, which is connected to the input 122 of the transient detection storage circuit 105 (to the input of the fuse 130). The MOSFET 301 also has a gate 307 connected to the output 114 of the transient threshold voltage control circuit 107. The node 132 is positioned within the string of Zener diodes 117-1 to 117-X within the transient threshold voltage control circuit 107, such that the sum of Zener voltages of Zener diodes (e.g., 117-2 to 117-X) between the node 132 and the input 112 of the transient threshold voltage control circuit 107 does not exceed a voltage rating of the MOSFET 301. Therefore, as with use of the SCR 119, the drain 303 of the MOSFET 301 can be connected anywhere in string of Zener diodes 117-1 to 117-X to trade-off between required fuse 130 blow energy, subsequent fuse 130 arcing, and MOSFET 301 voltage rating. In some embodiments, the transient detection circuit 109 optionally includes a Zener diode 309 that has a cathode connected to the gate 307 of the MOSFET 301, and that has an anode connected to the source 305 of the MOSFET 301. The Zener diode 309 is configured to prevent over voltage damage to the MOSFET 301. In some embodiments, the MOSFET 301 has a faster response time that the SCR 119. In some embodiments, the MOSFET 301 is selected for low capacitance and low on resistance, which are often conflicting requirements.

Figure 4:
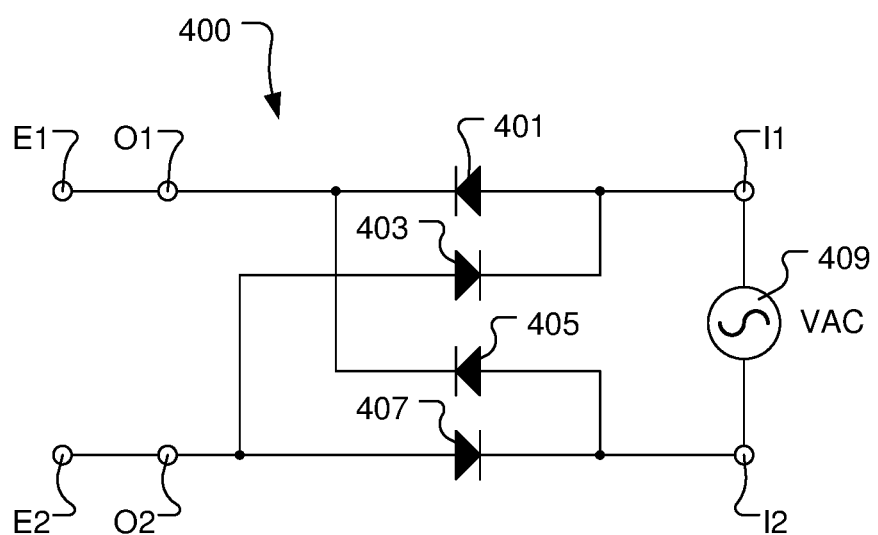
FIG. 4 shows an example rectifier circuit that can be positioned between the AC electrical supply and both the positive input terminal and the negative input terminal of the voltage transient detector, in accordance with some embodiments.

The voltage transient detector 101/101A is described with regard to detection of voltage transients associated with a direct current (DC) electrical supply being connected across the positive input terminal E1 and the negative input terminal E2. However, the voltage transient detector 101/101A can also be used for detection of voltage transients associated with an alternating current (AC) electrical supply by positioning a rectifier circuit between the AC electrical supply and both the positive input terminal E1 and the negative input terminal E2. FIG. 4 shows an example rectifier circuit 400 that can be positioned between the AC electrical supply and both the positive input terminal E1 and the negative input terminal E2 of the voltage transient detector 101/101A, in accordance with some embodiments.

The rectifier circuit 400 has a first input terminal I1, a second input terminal I2, a first output terminal O1, and a second output terminal O2. The first output terminal O1 is connected to the positive input terminal E1 of the voltage transient detector 101/101A. The second output terminal O2 is connected to the negative input terminal E2 of the voltage transient detector 101/101A. The first input terminal I1 and second input terminal I2 of the rectifier circuit 400 are connected to respective terminals of an AC voltage source 409 that is to be monitored for voltage transients that exceed the transient threshold voltage as set by the sum of Zener voltages of the string of Zener diodes 117-1 to 117-X within the transient threshold voltage control circuit 107. In some embodiments, the rectifier circuit 400 is a full wave diode bridge rectifier circuit that includes a first diode 401, a second diode 403, a third diode 405, and fourth diode 407. An anode of the first diode 401 is connected the first input terminal I1. A cathode of the first diode 401 is connected to the first output terminal O1. An anode of the second diode 403 is connected the second output terminal O2. A cathode of the second diode 403 is connected to the first input terminal I1. An anode of the third diode 405 is connected the second input terminal I2. A cathode of the third diode 405 is connected to the first output terminal O1. An anode of the fourth diode 407 is connected the second output terminal O2. A cathode of the fourth diode 407 is connected to the second input terminal I2. The diodes 401, 403, 405, and 407 rectify the AC voltage source 409 so that the voltage transient detector 101/101A can detect AC voltage transients with the positive rectified output on the positive input terminal E1 and with the negative rectified output on the negative input terminal E2.

Figure 5A:
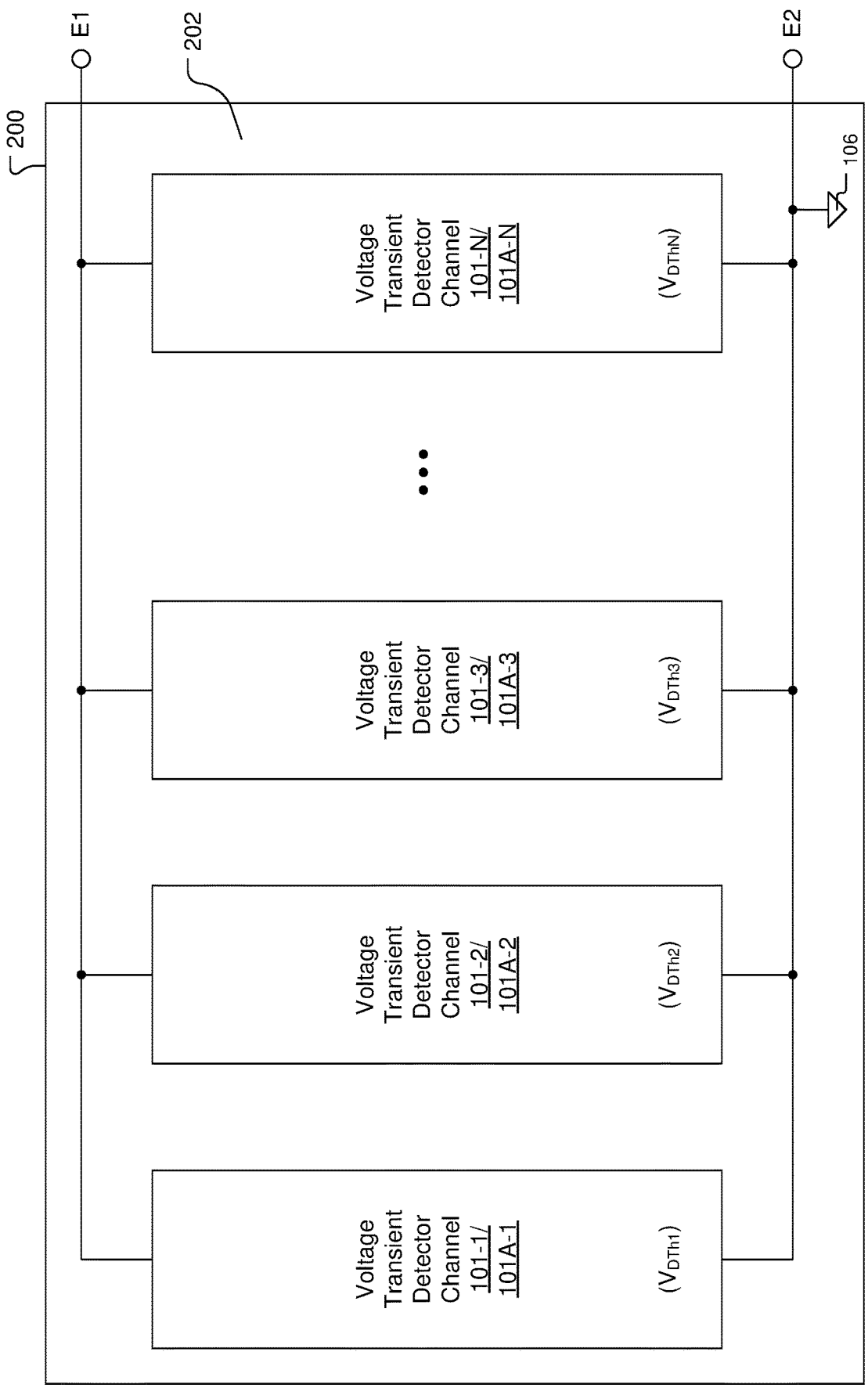
FIG. 5A shows a block-level layout of a voltage dot that includes a number (N) of voltage transient detectors implemented on a common PCB, in accordance with some embodiments.

In some embodiments, multiple instances of the voltage transient detector 101/101A can be implemented together on a PCB, with each instance of the voltage transient detector 101/101A having a different transient threshold voltage as set by the string of Zener diodes 117-1 to 117-X within the transient threshold voltage control circuit 107. FIG. 5A shows a block-level layout of a voltage dot 200, in accordance with some embodiments. The voltage dot 200 is an electrical circuit that provides a permanent indication of having detected/measured a threshold voltage level at the location of the voltage dot 200. In this manner, the voltage dot 200 is functionally analogous in some way to a temperature dot which provides a permanent indication of having detected/measured a threshold high or low temperature at the location of the temperature dot. The voltage dot 200 includes a number (N) of voltage transient detectors 101/101A implemented on a common PCB 202, in accordance with some embodiments. The number (N) of voltage transient detectors 101/101A can range from one to essentially any number of voltage transient detectors 101/101A that can fit on the PCB 202. In some embodiments, different voltage transient detectors 101/101A on the PCB 202 have different values of the transient threshold voltage as set by the string of Zener diodes 117-1 to 117-X within the transient threshold voltage control circuit 107. For example, FIG. 5A shows the that voltage transient detector 101-1/101A-1 has a transient threshold voltage of $V_{Dth1}$, and the voltage transient detector 101-2/101A-2 has a transient threshold voltage of $V_{Dth2}$, and the voltage transient detector 101-3/101A-3 has a transient threshold voltage of $V_{Dth3}$, and the voltage transient detector 101-N/101A-N has a transient threshold voltage of $V_{DthN}$. In some embodiments, however, multiple voltage transient detectors 101/101A on the PCB 202 have the same transient threshold voltage of $V_{Dth}$ for redundancy purposes. Each of the multiple voltage transient detectors 101/101A on the PCB 202 has its positive input terminal E1 connected together to a common positive input terminal E1. Also, each of the multiple voltage transient detectors 101/101A on the PCB 202 has its negative input terminal E2 connected together to a common positive negative terminal E2, which is connected to the reference potential 106. Therefore, in some embodiments, the voltage dot 200 includes the PCB 202 and a plurality of voltage transient detectors 101/101A formed on the PCB 202, where each of the plurality of voltage transient detectors 101/101A is configured to detect transient voltages above a corresponding transient threshold voltage $V_{Dth}$. In some embodiments, the corresponding transient threshold voltage $V_{Dth}$ is different for different ones of the plurality of voltage transient detectors 101/101A. Each of the plurality of voltage transient detectors 101/101A is configured to provide a persistent indication of having detected a voltage transient that exceeds the corresponding transient threshold voltage $V_{Dth}$.

Figure 5B:
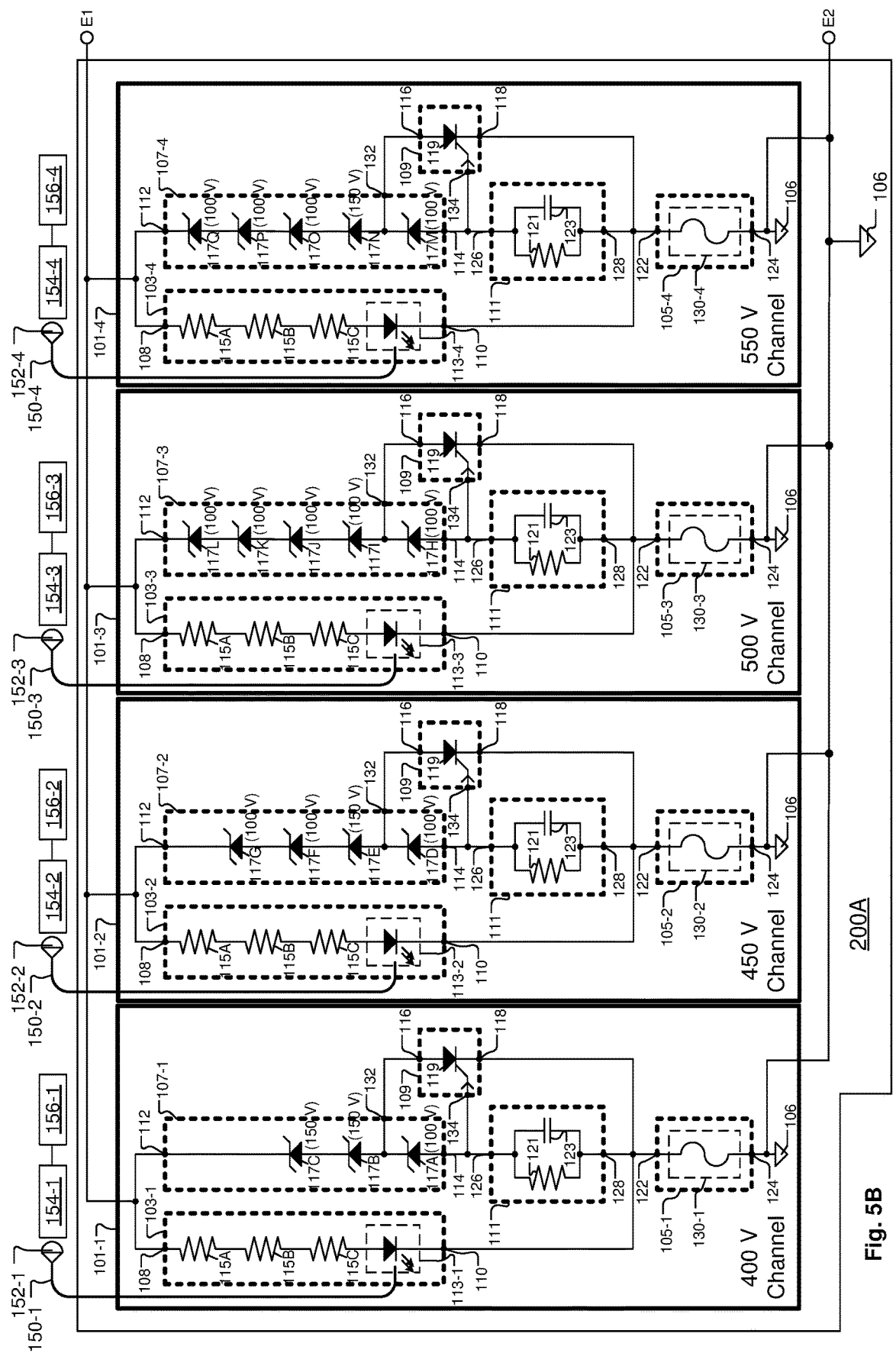
FIG. 5B shows an example implementation of a voltage dot that includes four voltage transient detectors, in accordance with some embodiments.

FIG. 5B shows an example implementation of a voltage dot 200A that includes four voltage transient detectors 101-1, 101-2, 101-3, and 101-4, in accordance with some embodiments. Each of the voltage transient detectors 101-1, 101-2, 101-3, and 101-4 is configured in the same manner as the voltage transient detector 101 described with regard to FIGS. 1A and 1B, with the exception that the string of Zener diodes 117-1 to 117-X is different in each of the voltage transient detectors 101-1, 101-2, 101-3, and 101-4 in order to provide each of the voltage transient detectors 101-1, 101-2, 101-3, and 101-4 with a different transient threshold voltage. Specifically, the voltage transient detector 101-1 includes three serially connected Zener diodes 117A, 117B, and 117C in the transient threshold voltage control circuit 107-1 to set a transient threshold voltage $V_{Dth101-1}$ of 400 V. Therefore, the SCR 119 in the voltage transient detector 101-1 will turn on when the voltage differential between the voltage at the positive input terminal E1 and the reference potential 106 at the negative input terminal E2 reaches or exceeds 400 V. The voltage transient detector 101-2 includes four serially connected Zener diodes 117D, 117E, 117F, and 117G in the transient threshold voltage control circuit 107-2 to set a transient threshold voltage $V_{Dth101-2}$ of 450 V. Therefore, the SCR 119 in the voltage transient detector 101-2 will turn on when the voltage differential between the voltage at the positive input terminal E1 and the reference potential 106 at the negative input terminal E2 reaches or exceeds 450 V. The voltage transient detector 101-3 includes five serially connected Zener diodes 117H, 117I, 117J, 117K, and 117L in the transient threshold voltage control circuit 107-3 to set a transient threshold voltage $V_{Dth101-3}$ of 500 V. Therefore, the SCR 119 in the voltage transient detector 101-3 will turn on when the voltage differential between the voltage at the positive input terminal E1 and the reference potential 106 at the negative input terminal E2 reaches or exceeds 500 V. The voltage transient detector 101-4 includes five serially connected Zener diodes 117M, 117N, 117O, 117P, and 117Q in the transient threshold voltage control circuit 107-4 to set a transient threshold voltage $V_{Dth101-4}$ of 550 V. Therefore, the SCR 119 in the voltage transient detector 101-4 will turn on when the voltage differential between the voltage at the positive input terminal E1 and the reference potential 106 at the negative input terminal E2 reaches or exceeds 550 V. In some embodiments, the SCR 119 in each of the voltage transient detectors 101-1, 101-2, 101-3, and 101-4 is configured in substantially the same manner. Also, in some embodiments, the filter circuit 111 in each of the voltage transient detectors 101-1, 101-2, 101-3, and 101-4 is configured in substantially the same manner.

Also, each of the voltage transient detectors 101-1, 101-2, 101-3, and 101-4 has its own transient detection storage circuit 105-1, 105-2, 105-3, and 105-4, respectively, with its own fuse 130-1, 130-2, 130-3, and 130-4, respectively. Therefore, the voltage transient detectors 101-1, 101-2, 101-3, and 101-4 are able to operate independently of each other with respect to detecting and persistently indicating occurrence of a voltage transient that exceeds its corresponding transient threshold voltage. Also, each of the voltage transient detectors 101-1, 101-2, 101-3, and 101-4 has its own transient indicator circuit 103-1, 103-2, 103-3, and 103-4, respectively, with its own LED 113-1, 113-2, 113-3, and 113-4, respectively. In some embodiments, the LEDs 113-1, 113-2, 113-3, and 113-4 are different colors to make is easier to identify which the voltage transient detectors 101-1, 101-2, 101-3, and 101-4 has detected a voltage transient that exceeds its transient threshold voltage. In some embodiments, each of the LEDs 113-1, 113-2, 113-3, and 113-4 is optically coupled to a respective optical fiber 150-1, 150-2, 150-3, and 150-4, respectively. In some embodiments, the optical fibers 150-1, 150-2, 150-3, and 150-4 are bundled together and routed to a monitoring location away from the voltage measurement location where the voltage dot 200A is positioned. In some embodiments, each of the optical fibers 150-1, 150-2, 150-3, and 150-4 is terminated by a lens 152-1, 152-2, 152-3, and 152-4, respectively. In some embodiments, each of the optical fibers 150-1, 150-2, 150-3, and 150-4 is positioned to project light into a photodetector 154-1, 154-2, 154-3, and 154-4, respectively. Also, in some embodiments, each photodetector 154-1, 154-2, 154-3, and 154-4 is connected to a data acquisition system 156-1, 156-2, 156-3, and 156-4, respectively, to periodically record the status of light emanating from the optical fibers 150-1, 150-2, 150-3, and 150-4. In some embodiments, each photodetector 154-1, 154-2, 154-3, and 154-4 is connected to a different channel in the same data acquisition system 156 to periodically record the status of light emanating from the optical fibers 150-1, 150-2, 150-3, and 150-4.

The voltage transient detector 101/101A and voltage dot 200/200A can be used in many places in a semiconductor fabrication plasma processing system, and has particular usefulness in monitoring for voltage transients in places that are difficult and/or dangerous to reach, such as near a chuck or downstream in a radiofrequency (RF) power supply path where components are subjected to RF fields. The voltage transient detector 101/101A and voltage dot 200/200A are also particularly useful anywhere it may be hazardous to open up the tool, such as in places where it is not possible to put clamp leads on, such as places where there may be a very high floating potential, by way of example. However, it should be understood that the voltage transient detector 101/101A and voltage dot 200/200A disclosed herein are not just limited to use in the semiconductor fabrication industry. The voltage transient detector 101/101A and voltage dot 200/200A can be used in any industry where it is necessary to detect and report the occurrence of voltage transients that exceed a set transient threshold voltage, such as in electrical power distribution systems, by way of example. In order to detect fast voltage transients, the voltage transient detector 101/101A and/or voltage dot 200/200A should be connected close to the voltage measurement location. Light pipes, such as optical fibers, can be used to convey the indicator light signals from the LEDs 113 to a remote location for conve-nient and safe observation and monitoring. In some embodiments, the voltage transient detector 101/101A and/or voltage dot 200/200A is located within a range of up to 20 centimeters away from the voltage measurement location, with an electrical lead connecting the positive input terminal E1 to the voltage measurement location and with another electrical lead connecting the negative input terminal E2 to the reference potential 106.

Figure 6:
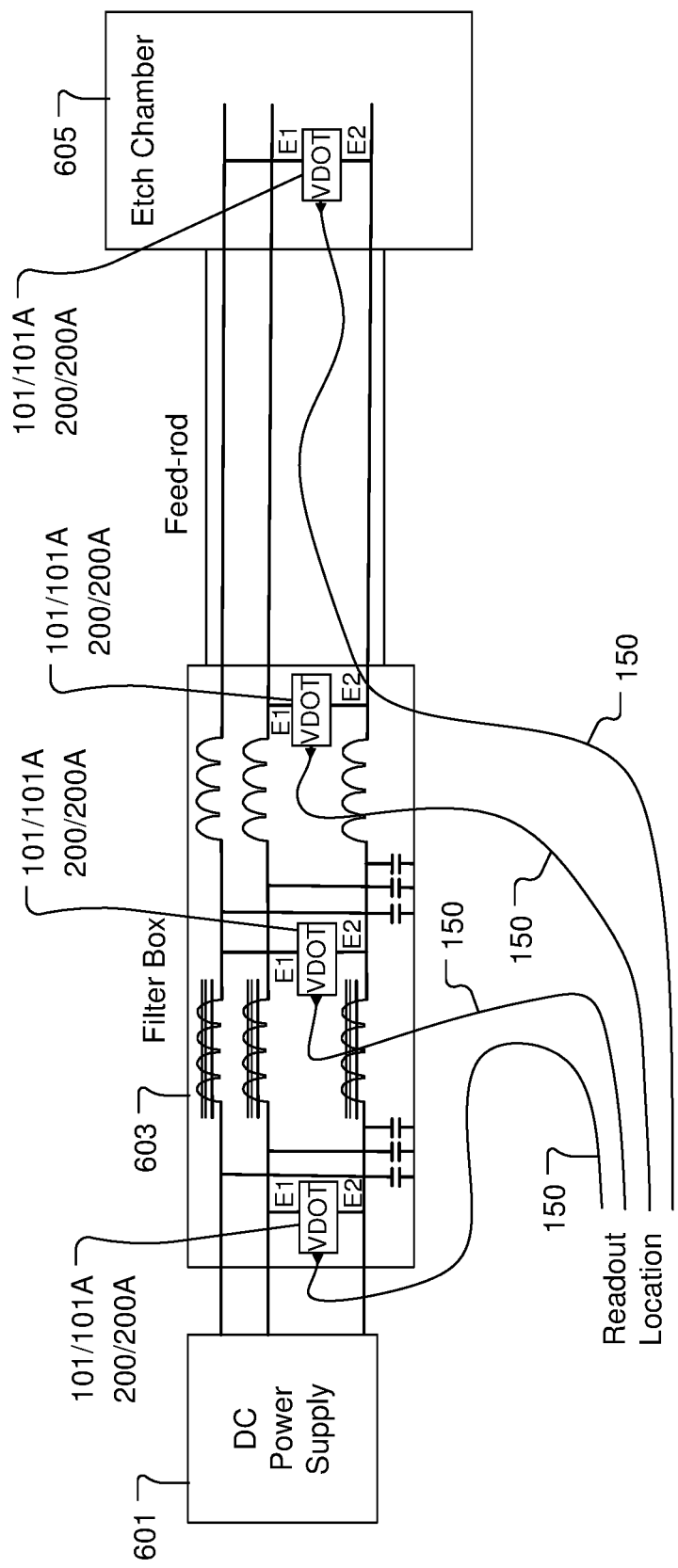
FIG. 6 shows an example deployment of voltage transient detectors and/or voltage dots within a semiconductor fabrication system, in accordance with some embodiments.

FIG. 6 shows an example deployment of voltage transient detectors 101/101A and/or voltage dots 200/200A within a semiconductor fabrication system, in accordance with some embodiments. In the example of FIG. 6, a DC power supply 601 is connected through an RF filter box 603 to multiple heaters within a chuck within a plasma processing chamber 605. One or more of the voltage transient detectors 101/101A and/or voltage dots 200/200A are deployed within the RF filter box 603 and plasma processing chamber 605 to monitor for the occurrence of voltage transients at various voltage measurement locations. The various voltage measurement locations can have very high DC and/or RF potentials which require isolation. Therefore, the light output by the LEDs 113 of the various voltage transient detectors 101/101A and/or voltage dots 200/200A is conveyed through optical fibers 150 to an external location for observation and monitoring. In some embodiments, the light emitted from the optical fibers 150 is periodically monitored/checked during equipment inspections. In some embodiments, additional circuits are used to enable a host computer to log the time of a change in the illumination status of an LED 113. As previously discussed, the photodetector 154 can be used to monitor the light emitted from the optical fibers 150 and generate a corresponding electrical signal that is provided to a data input interface of the host computer. The host computer is programmed to periodically or continuously monitor the state of the electrical signals received through the data input interface to log any change in the light emitted from the optical fibers 150 and thereby provide a time stamp of when a voltage transient is detected by any one of the various voltage transient detectors 101/101A and/or voltage dots 200/200A that are deployed.

Figure 7:
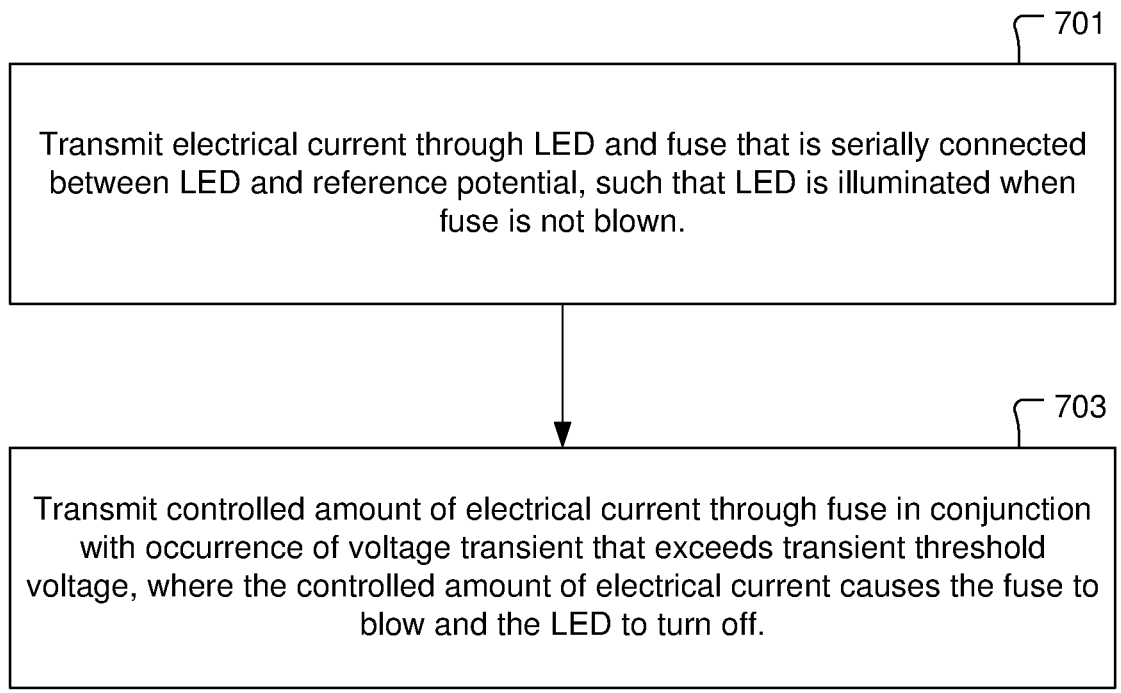
FIG. 7 shows a flowchart of a method for detecting voltage transients, in accordance with some embodiments.

FIG. 7 shows a flowchart of a method for detecting voltage transients, in accordance with some embodiments. The method includes an operation 701 for transmitting electrical current through an LED 113 and a fuse 130 that is serially connected between the LED 113 and a reference potential 106, such that the LED 113 is illuminated when the fuse 130 is not blown. The method also includes an operation 703 for transmitting a controlled amount of electrical current through the fuse 130 in conjunction with occurrence of a voltage transient that exceeds a transient threshold voltage. The voltage transient occurs at a voltage measurement location. The controlled amount of electrical current causes the fuse 130 to blow and the LED 113 to turn off.

In some embodiments, the method also includes using a voltage present at the voltage measurement location to power the LED 113. In some embodiments, the method also includes controlling a flow of electrical current through the LED 113 to be within an operational current range of the LED 113 when the fuse 113 is not blown. For example, a number of resistors 115A, 115B, 115C can be connected between the LED 113 and the voltage measurement location from which power is obtained to turn on the LED 113, where the resistors 115A, 115B, 115C function to control the flow of electrical current through the LED 113 to be within the operational current range of the LED 113. In some embodiments, the method includes using a string of serially connected Zener diodes 117-1 to 117-X to set the transient threshold voltage. In some embodiments, the string of serially connected Zener diodes 117-1 to 117-X is connected between the voltage measurement location and the gate of the SCR 119. The SCR 119 has an anode connected to the node 132 within the string of serially connected Zener diodes 117-1 to 117-X. The SCR 119 has a cathode connected to the fuse 130 such that electrical current flowing through the SCR 119 flows through the fuse 130 to the reference potential 106.

In some embodiments, the method also includes conveying light from the LED 113 through an optical fiber 150 to a remote observation location away from the voltage measurement location. In some embodiments, the method includes operating a photodetector device 154 to detect a change in light emitted by the optical fiber 150. Also, in some embodiments, the method includes operating a data acquisition system 156 to record signals output by the photodetector device 154 as a function of time, where the signals output by the photodetector device 154 indicate whether or not the LED 113 is illuminated, which in turn indicates whether or not a voltage transient has occurred to cause the fuse 130 to blow.

In an alternative embodiment, the voltage transient detector (e.g., 101, 101A, 200, 200A) can be configured to use several latched high-speed comparators to determine when a voltage transient occurs. A first input of each latched high-speed comparator is the voltage at the positive input terminal E1. A second input of each latched high-speed comparator is a corresponding transient threshold voltage that can be set using a configuration of resistors connected between a power source and the second input of the latched high-speed comparator. An output of each latched high-speed comparator is a signal indicating whether or not the corresponding transient threshold voltage has been exceeded by the voltage measured at the positive input terminal E1. In some embodiments, the outputs of the latched high-speed comparators are monitored by a microcontroller that periodically logs the latched state of the latches within the high-speed comparators. Also, in some embodiments, the microcontroller can be configured to control illumination of an LED to provide an indication of when a particular latched high-speed comparator has been triggered by a voltage transient that exceed the corresponding transient threshold voltage of the particular high-speed comparator. In some embodiments, the LED will turn off when power is removed from the voltage transient detector, but a permanent record of latch tripping will remain stored in the microcontroller's non-volatile data memory. Power to operate the high-speed comparators, the microcontroller, and the LEDs if present, can be obtained from either the system under test or from batteries.

In another alternative embodiment, the voltage transient detector (e.g., 101, 101A, 200, 200A) can be configured to implement a high-speed analog-to-digital converter and a field programmable gate array (FPGA) and a microcontroller to log and store data indicating when voltage transients occur. Firmware could then sort the data and indicate the time of occurrence and magnitude of the voltage transient. Also, an interface to convey the detection of voltage transients to a remote monitoring location can be either electrically-based or optically-based.

In another alternative embodiment, the voltage transient detector (e.g., 101, 101A, 200, 200A) can be configured to implement optocouplers instead of LEDs 113 to provide an electrical signal that indicates the occurrence of a voltage transient that exceeds the transient threshold voltage. Also, in another alternative embodiment, the voltage transient detector (e.g., 101, 101A, 200, 200A) can be configured to implement a chemical indicator that has a strong electric field dependence to indicate the occurrence of a voltage transient that exceeds the transient threshold voltage. The chemical indicator is placed between two electrodes whose electrical potential difference will drive the chemical reaction within the chemical indicator to provide the proper indication of occurrence of the voltage transient. For example, in some embodiments, a color change of the chemical indicator indicates the occurrence of a voltage transient that exceeds the transient threshold voltage. In some embodiments, the chemical indicator is implemented as a liquid crystal indicator that exhibits molecular rotation to cause changes in polarization and/or optical transmission properties when a certain voltage level is applied.

Figure 8A:
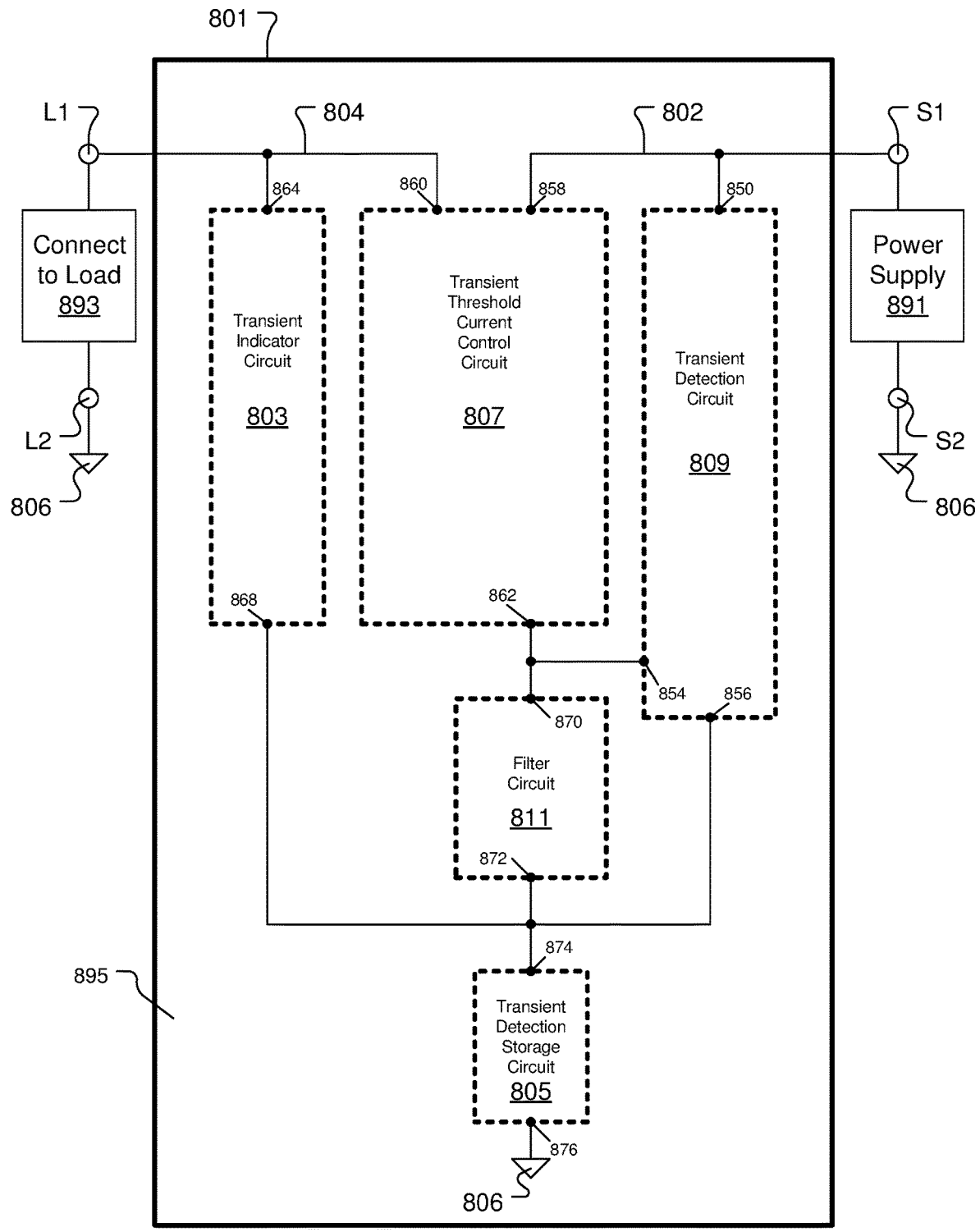
FIG. 8A shows a current transient detector, in accordance with some embodiments.
Figure 8B:
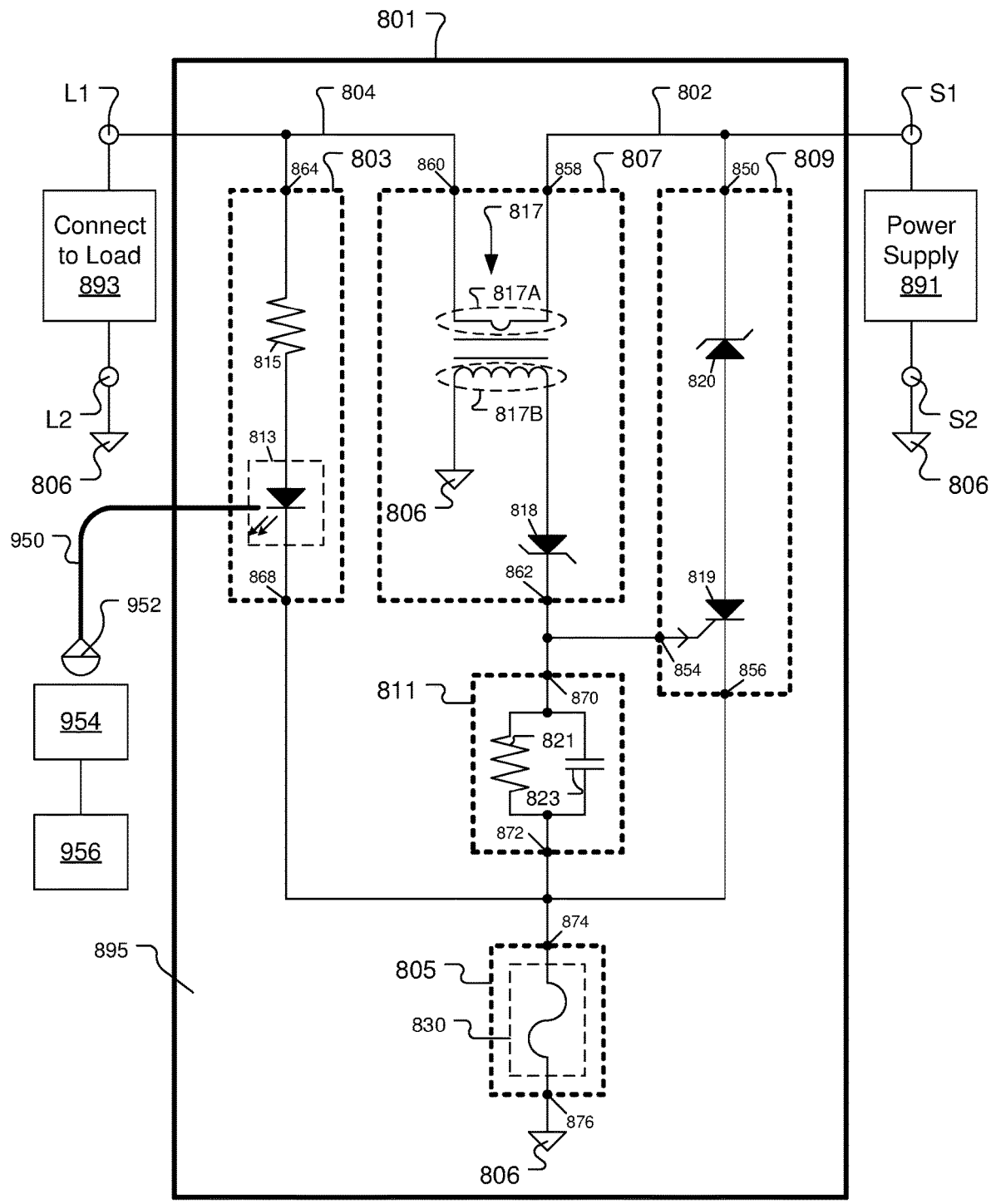
FIG. 8B shows an example implementation of the current transient detector, in accordance with some embodiments.

FIG. 8A shows a current transient detector 801, in accordance with some embodiments. FIG. 8B shows an example implementation of the current transient detector 801, in accordance with some embodiments. The current transient detector 801 is implemented on a PCB 895. The current transient detector 801 includes a first input terminal S1 and a second input terminal S2 that are connected to a power supply 891. The first input terminal S1 is connected to a positive terminal of the power supply 891. The second input terminal S2 is connected to a reference potential 806. The current transient detector 801 also includes a first output terminal L1 and a second output terminal L2 that are connected to an electrical load 893. The first output terminal L1 is the positive terminal for the electrical load 893. The second output terminal L2 is connected to the reference ground potential 806. The current transient detector 801 includes an input line 802 that extends from the first input terminal S1 to both an input 850 of a transient detection circuit 809 and an input 858 of a transient threshold current control circuit 807. The current transient detector 801 also includes an output line 804 that extends from the first output terminal L1 to both an input 864 of a transient indicator circuit 803 and a first output 860 of the transient threshold current control circuit 807. Within the transient threshold current control circuit 807, the input line 802 is connected to a first end of primary winding 817A of a current transformer 817. Also, within the transient threshold current control circuit 807, the output line 804 is connected to a second end of the primary winding 817A. The current transformer 817 within transient threshold current control circuit 807 includes a secondary winding 817B that has a first end connected to an anode of a Zener diode 818 and a second end connected to the reference potential 806. A cathode of the Zener diode 818 is connected to an output 862 of the transient threshold current control circuit 807.

The transient detection circuit 809 includes an SCR 819 that has an anode connected to an anode of a Zener diode 820. A cathode of the Zener diode 820 is connected to the input line 802 at the input 850 of the transient detection circuit 809. A cathode of the SCR 819 is connected to an output 856 of the transient detection circuit 809. A gate of the SCR 819 is connected to the output 862 of the transient threshold current control circuit 807. The output 856 of the transient detection circuit 809 is connected to an input 874 of a transient detection storage circuit 805. The transient detection storage circuit 805 has an output 876 connected to the reference potential 806. In some embodiments, the transient detection storage circuit 805 includes a fuse 830 connected between the input 874 and the output 876.

The transient indicator circuit 803 has an output 868 connected to the input 874 of the transient detection storage circuit 805. In some embodiments, the transient indicator circuit 803 includes an LED 813 that has an anode connected through a resistor 815 to the output line 804 at the input 864 of the transient indicator circuit 803. In some embodiments, the current transient detector 801 optionally includes a filter circuit 811 that has an input 870 connected to the output 862 of the transient threshold current control circuit 807. The filter circuit 811 has an output 872 connected to the input 874 of the transient detection storage circuit 805. In some embodiments, the filter circuit 811 includes both a resistor 821 connected between the input 870 and the output 872, and a capacitor 823 connected between the input 870 and the output 872. The filter circuit 811 protects the gate of the SCR 819 from electrical noise. Also, capacitor 823 provides an SCR 819 trigger magnitude that is proportional to a magnitude of the time integrated current spike at the output 862 of the transient threshold current control circuit 807.

In the current transient detector 801, load current flows from the first input terminal S1, through the primary winding 817A of the current transformer 817, to the first output terminal L1. The current transformer 817 has a primary-to-secondary turn ratio of 1:N1, where the secondary winding 817B includes N1 turns for every one turn of the primary winding 817A. The primary-to-secondary turn ratio of 1:N1 is set to provide a particular transient threshold current at or above which enough current will flow through the Zener diode 818 to the gate of the SCR 819 to turn on the SCR 819 and correspondingly cause the fuse 830 to blow, thereby leaving a permanent record that a transient current flowing between S1 and L1 exceeded the transient threshold current set by the current transformer 817. The Zener diode 818 provides for rapid reset of the current transformer 817.

The load current flowing through the output line 804 causes the LED 813 to turn on, so long as the fuse 830 is intact. When the fuse 830 blows, the LED 813 goes off, which indicates that the fuse 830 blew because of occurrence of a transient current that exceeded the transient threshold current. Transient (surge) current through the primary winding 817A of the current transformer 817 causes a current of 1/N1 to flow through the output of the transient threshold current control circuit 807 and to the gate of the SCR 819. When the current flowing through the gate of the SCR 819 is large enough, the SCR 819 turns on and a large amount of current flows through the Zener diode 820 and the SCR 819 to cause the fuse 830 to blow and the LED 813 to turn off. The Zener diode 820 serves to limit the energy that can be delivered to the fuse 830, so that the fuse 830 can be reliably blown with out remaking contact or catching fire.

In some embodiments, the current transformer 817 can have different secondary tap ratios or separate secondary windings to provide different transient threshold currents from the one current transformer 817. Also, in some embodiments, a MOSFET can be used instead of the SCR 819, such as described with regard to the MOSFET 301 in FIG. 3. Also, in some embodiments, the polarity of the current transient detector 801 can be changed by reversing the transformer windings within the current transformer 817 or by reversing the direction of load current flow between the first input terminal S1 and the first output terminal L1. In some embodiments, the voltage at the output 862 of the transient threshold current control circuit 807 is low enough to require some amplification to drive the gate of the SCR 819. In some alternative embodiments, the current transformer 817 is replaced by a resistive shunt or a Hall Effect device that is configured to provide a sufficiently fast response time to enable detection of fast current transients on the load line between S1 and L1.

Figure 9A:
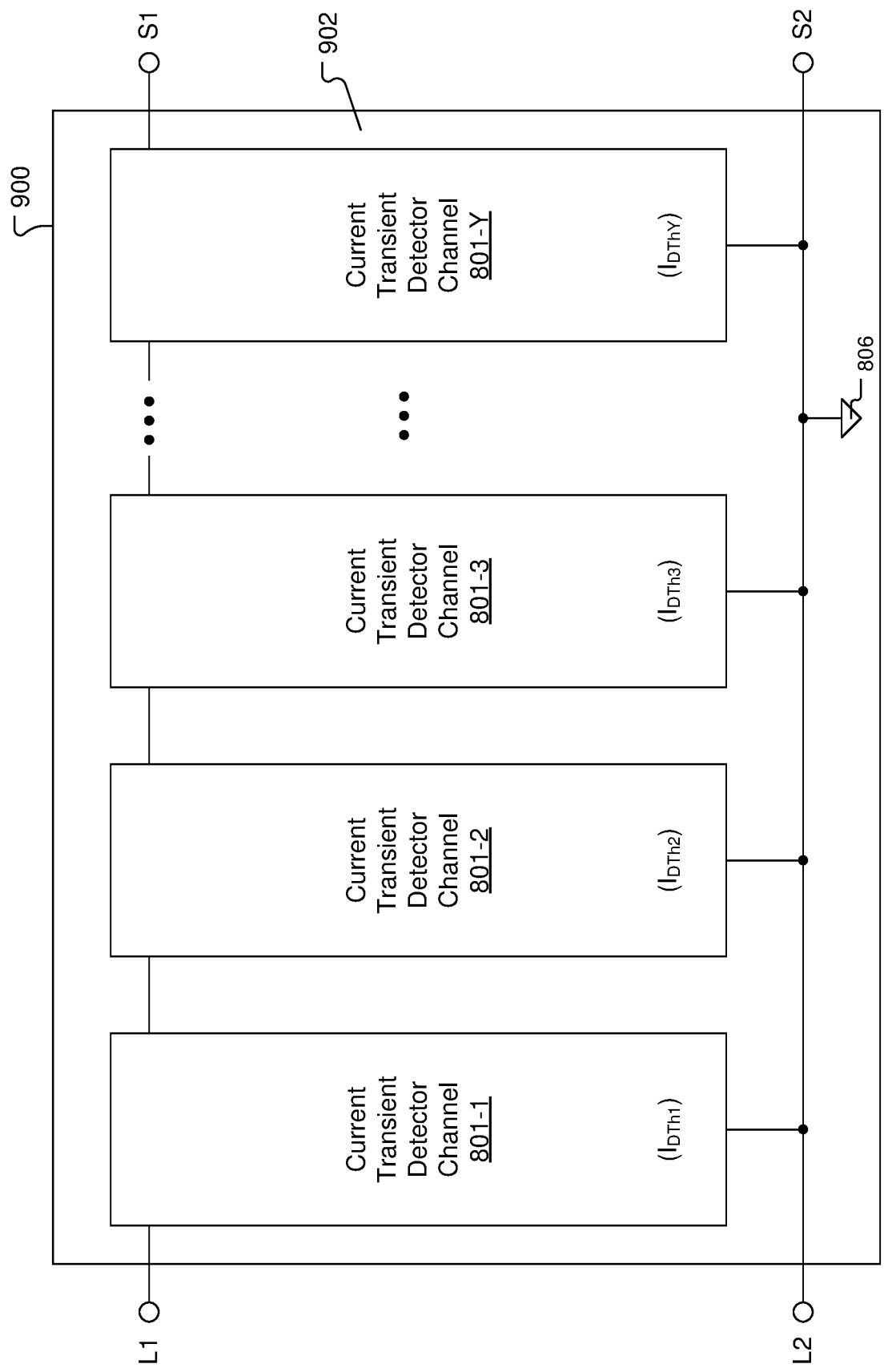
FIG. 9A shows a block-level layout of a current dot that includes a number (Y) of current transient detectors implemented on a common PCB, in accordance with some embodiments.

In some embodiments, multiple instances of the current transient detector 801 can be implemented together on a PCB, with each instance of the current transient detector 801 having a different transient threshold current as set by the current transformer 817 within the transient threshold current control circuit 807. FIG. 9A shows a block-level layout of a current dot 900 that includes a number (Y) of current transient detectors 801-1 to 801-Y implemented on a common PCB 902, in accordance with some embodiments. The number (Y) of current transient detectors 801-1 to 801-Y can range from one to essentially any number of current transient detectors 801 that can fit on the PCB 902. In some embodiments, different current transient detectors 801 on the PCB 902 have different values of the transient threshold current as set by the current transformer 817 within the transient threshold current control circuit 807. For example, FIG. 9A shows the that current transient detector 801-1 has a transient threshold current of $I_{Dth1}$, and the current transient detector 801-2 has a transient threshold current of $I_{Dth2}$, and the current transient detector 801-3 has a transient threshold current of $I_{Dth3}$, and the current transient detector 801-N has a transient threshold current of $I_{DthN}$. In some embodiments, however, multiple current transient detectors 801 on the PCB 902 have the same transient threshold current of $I_{Dth}$ for redundancy purposes.

The multiple current transient detectors 801-1 to 801-Y on the PCB 902 are serially connected such that the primary windings 817A of the current transformers 817 in the multiple current transient detectors 801-1 to 801-Y are serially connected. In this manner, the load current flows from the first input terminal S1 serially through the primary windings 817A of the multiple current transient detectors 801-1 to 801-Y to the first output terminal L1. Also, each of the multiple current transient detectors 801-1 to 801-Y on the PCB 902 has its reference potential connected to both the second input terminal S2 and the second output terminal L2.

Figure 9B:
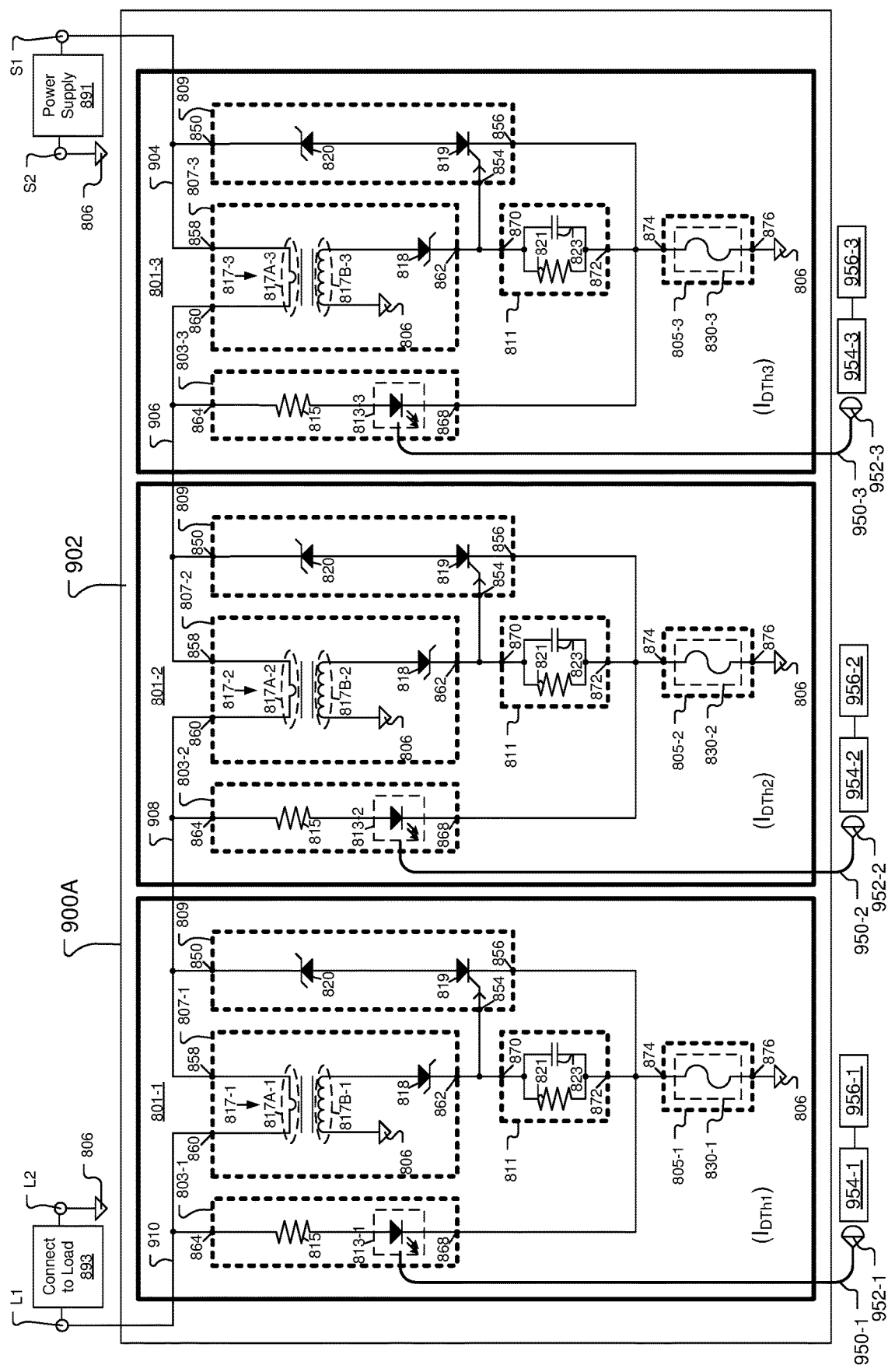
FIG. 9B shows an example implementation of a voltage dot that includes three current transient detectors, in accordance with some embodiments.

FIG. 9B shows an example implementation of a voltage dot 900A that includes three current transient detectors 801-1, 801-2, and 801-3, in accordance with some embodiments. Each of the current transient detectors 801-1, 801-2, and 801-3 is configured in the same manner as the current transient detector 801 described with regard to FIGS. 8A and 8B, with the exception that the current transformer 817 is different in each of the current transient detectors 801-1, 801-2, and 801-3, in order to provide each of the current transient detectors 801-1, 801-2, and 801-3, with a different transient threshold current $I_{Dth}$. Specifically, the current transient detector 801-1 includes a transient threshold current control circuit 807-1 that includes a current transformer 817-1 that includes a primary-to-secondary turn ratio of 1:N1, where the secondary winding 817B-1 includes N1 turns for every one turn of the primary winding 817A-1. The current transient detector 801-2 includes a transient threshold current control circuit 807-2 that includes a current transformer 817-2 that includes a primary-to-secondary turn ratio of 1:N2, where the secondary winding 817B-2 includes N2 turns for every one turn of the primary winding 817A-2. The current transient detector 801-3 includes a transient threshold current control circuit 807-3 that includes a current transformer 817-3 that includes a primary-to-secondary turn ratio of 1:N3, where the secondary winding 817B-3 includes N3 turns for every one turn of the primary winding 817A-3. The values of N1, N2, and N3 are different so that the current transformers 817-1, 817-2, and 817-3, respectively, provide different values for the transient threshold current. Larger values of N1, N2, and N3 result in smaller current at the gate of the SCR 819 and correspondingly reduced sensitivity.

The load current flows from the first input terminal S1 through a line 904, and through the primary winding 817A-3 of the current transformer 817-3 of the current transient detector 801-3, and through a line 906, and through the primary winding 817A-2 of the current transformer 817-2 of the current transient detector 801-2, and through a line 908, and through the primary winding 817A-1 of the current transformer 817-1 of the current transient detector 801-1, and through a line 910 to the first output terminal L1. In this manner, the current dot 900A uses series connected current transformers 817-1, 817-2, and 817-3 to provide current pulses that will trigger their associated SCRs 819 when the current through the secondary windings 817B-1, 817B-2, and 817B-3, respectively, is above the SCR 819 turn on current.

Also, each of the current transient detectors 801-1, 801-2, and 801-3 has its own transient detection storage circuit 805-1, 805-2, and 805-3, respectively, with its own fuse 830-1, 830-2, and 830-3, respectively. Therefore, the current transient detectors 801-1, 801-2, and 801-3 are able to operate independently of each other with respect to detecting and indicating occurrence of a transient current that exceeds its corresponding transient threshold current. Also, each of the current transient detectors 801-1, 801-2, and 801-3 has its own transient indicator circuit 803-1, 803-2, and 803-3, respectively, with its own LED 813-1, 813-2, and 813-3, respectively. In some embodiments, the LEDs 813-1, 813-2, and 813-3 are different colors to make is easier to identify which of the current transient detectors 801-1, 801-2, and 801-3 has detected a transient current that exceeds its transient threshold current. In some embodiments, each of the LEDs 813-1, 813-2, and 813-3 is optically coupled to a respective optical fiber 950-1, 950-2, and 950-3, respectively. In some embodiments, the optical fibers 950-1, 950-2, and 950-3 are bundled together and routed to a monitoring location away from the location where the current dot 900A is positioned. In some embodiments, each of the optical fibers 950-1, 950-2, and 950-3 is terminated by a lens 952-1, 952-2, and 952-3, respectively. In some embodiments, each of the optical fibers 950-1, 950-2, and 950-3 is positioned to project light into a photodetector 954-1, 954-2, and 954-3, respectively. Also, in some embodiments, each photodetector 954-1, 954-2, and 954-3 is connected to a data acquisition system 956-1, 956-2, and 956-3, respectively, to periodically record the status of light emanating from the optical fibers 950-1, 950-2, and 950-3. In some embodiments, each photodetector 954-1, 954-2, and 954-3 is connected to a respective channel of a same data acquisition system 956 to periodically record the status of light emanating from the optical fibers 950-1, 950-2, and 950-3.

Figure 10:
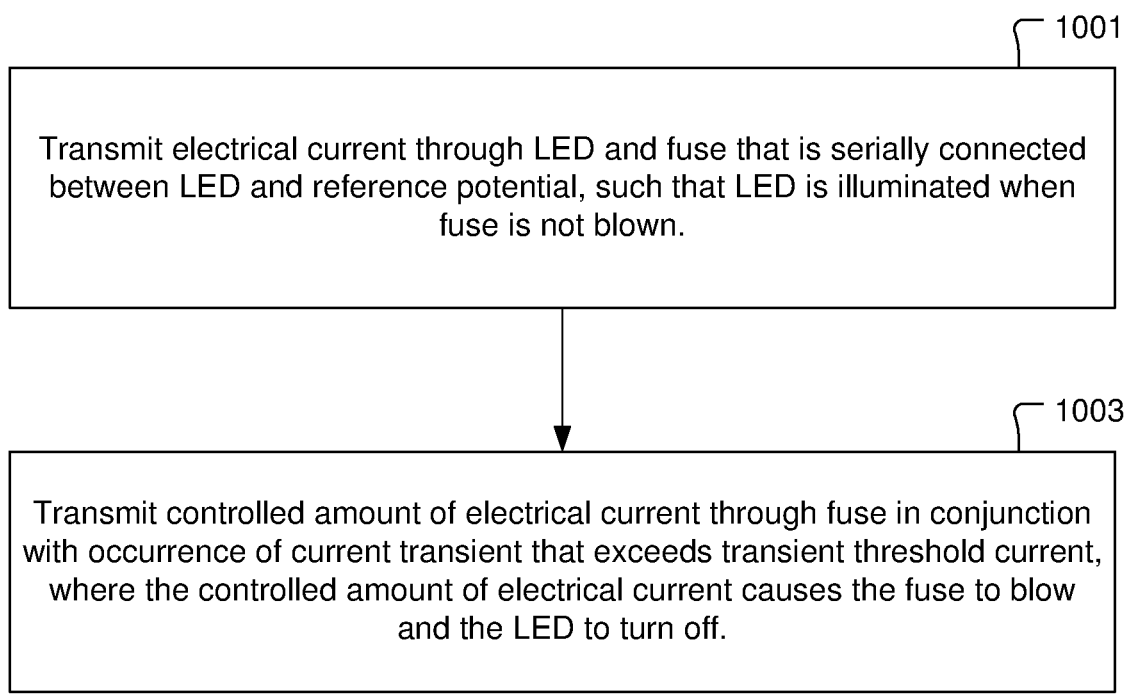
FIG. 10 shows a flowchart of a method for detecting current transients, in accordance with some embodiments.

FIG. 10 shows a flowchart of a method for detecting current transients, in accordance with some embodiments. The method includes an operation 1001 for transmitting electrical current through an LED 813 and a fuse 830 that is serially connected between the LED 813 and a reference potential 806, such that the LED 813 is illuminated when the fuse 830 is not blown. The method also includes an operation 1003 for transmitting a controlled amount of electrical current through the fuse 830 in conjunction with the occurrence of a current transient that exceeds a transient threshold current. The current transient occurs on a load line through which current flows from a power supply to an electrical load. The controlled amount of electrical current causes the fuse 830 to blow and the LED 813 to turn off.

In some embodiments, the method also includes using a current present on the load line to power the LED 813. In some embodiments, the method also includes controlling a flow of electrical current through the LED 813 to be within an operational current range of the LED 813 when the fuse 813 is not blown. For example, a resistor 815 can be connected between the LED 813 and the load line, where the resistor 815 functions to control the flow of electrical current through the LED 813 to be within the operational current range of the LED 813. In some embodiments, the method includes using a current transformer 817 to set the transient threshold current. In some embodiments, a primary winding 817A of the current transformer 817 is serially connected along/within the load line. In some embodiments, an SCR 819 is triggered on in order to transmit the controlled amount of electrical current through the fuse 830 in conjunction with the current transient that exceeds the transient threshold current occurring on the load line. The SCR 819 has an anode connected to the load line through a Zener diode 820. The SCR 819 has a cathode connected to the fuse 830 such that electrical current flowing through the SCR 819 flows through the fuse 830 to the reference potential 806.

In some embodiments, the method also includes conveying light from the LED 813 through an optical fiber 950 to a remote observation location away from the current measurement location. In some embodiments, the method includes operating a photodetector device 954 to detect a change in light emitted by the optical fiber 950. Also, in some embodiments, the method includes operating a data acquisition system 956 to record signals output by the photodetector device 954 as a function of time, where the signals output by the photodetector device 954 indicate whether or not the LED 813 is illuminated, which in turn indicates whether or not a current transient has occurred on the load line to cause the fuse 830 to blow.

Although the foregoing disclosure includes some detail for purposes of clarity of understanding, it will be apparent that certain changes and modifications can be practiced within the scope of the appended claims. For example, it should be understood that one or more features from any embodiment disclosed herein may be combined with one or more features of any other embodiment disclosed herein. Accordingly, the present embodiments are to be considered as illustrative and not restrictive, and what is claimed is not to be limited to the details given herein, but may be modified within the scope and equivalents of the described embodiments.

What is claimed is:

1. A voltage transient detector, comprising:
   a positive terminal configured for connection to a voltage measurement location;
   a negative terminal configured for connection to a reference potential;
   a transient indicator circuit having an input connected to the positive terminal;
   a transient detection storage circuit having an input connected to an output of the transient indicator circuit, the transient detection storage circuit having an output connected to the reference potential;
   a transient threshold voltage control circuit having an input connected to the positive terminal; and
   a transient detection circuit having a first input connected to a node within the transient threshold voltage control circuit, the transient detection circuit having a second input connected to an output of the transient threshold voltage control circuit, the transient detection circuit having an output connected to the input of the transient detection storage circuit.

2. The voltage transient detector as recited in claim 1, wherein a light emitting diode is connected between the input and the output of the transient indicator circuit.

3. The voltage transient detector as recited in claim 2, wherein a resistor is connected between the input of the transient indicator circuit and the light emitting diode.

4. The voltage transient detector as recited in claim 2, further comprising:
an optical fiber having a first end positioned to couple in light emitted by the light emitting diode, the optical fiber having a second end position at a remote monitoring location away from the voltage measurement location.

5. The voltage transient detector as recited in claim 4, further comprising:
a lens optically coupled to the second end of the optical fiber, the lens configured to display light transmitted through the second end of the optical fiber.

6. The voltage transient detector as recited in claim 4, further comprising:
a photodetector optically coupled to the second end of the optical fiber, the photodetector configured to detect light transmitted through the second end of the optical fiber and generate an electrical signal indicative of the detected light; and
a data acquisition device connected to receive the electrical signal from the photodetector, the data acquisition device configured to record data that memorializes when a change occurs in the electrical signal received from the photodetector device.

7. The voltage transient detector as recited in claim 1, wherein the transient detection storage circuit is a fuse.

8. The voltage transient detector as recited in claim 1, wherein the transient detection storage circuit is a latching relay.

9. The voltage transient detector as recited in claim 1, wherein the transient detection storage circuit includes a liquid crystal element.

10. The voltage transient detector as recited in claim 1, wherein the transient detection storage circuit includes a micro-electromechanical system (MEMS) device.

11. The voltage transient detector as recited in claim 1, wherein the transient detection storage circuit includes an electrically erasable programmable read-only memory (EEPROM) device or an erasable programmable read-only memory (EPROM) device connected to deposit charge on a gate of a metal-oxide-semiconductor field-effect transistor (MOSFET).

12. The voltage transient detector as recited in claim 1, wherein the transient threshold voltage control circuit includes at least one Zener diode connected between the input and the output of the transient threshold voltage control circuit, wherein a sum of Zener voltages of the at least one Zener diode sets a threshold voltage for voltage transient detection.

13. The voltage transient detector as recited in claim 1, wherein the transient threshold voltage control circuit includes a plurality of Zener diodes serially connected between the input and the output of the transient threshold voltage control circuit, wherein a sum of Zener voltages of the plurality of Zener diodes sets a threshold voltage for voltage transient detection.

14. The voltage transient detector as recited in claim 13, wherein the node to which the first input of the transient detection circuit is connected is located between an adjacent pair of serially connected Zener diodes in the plurality of Zener diodes.

15. The voltage transient detector as recited in claim 14, wherein a sum of Zener voltages of Zener diodes between the node and the input of the transient threshold voltage control circuit does not exceed a voltage rating of a fuse within the transient detection storage circuit.

16. The voltage transient detector as recited in claim 15, wherein the transient detection circuit includes a silicon controlled rectifier having an anode connected to the first input of the transient detection circuit and a cathode connected to the output of the transient detection circuit and a gate connected to the output of the transient threshold voltage control circuit.

17. The voltage transient detector as recited in claim 15, wherein the transient detection circuit includes a metal-oxide-semiconductor field-effect transistor (MOSFET) having a drain connected to the first input of the transient detection circuit and a source connected to the output of the transient detection circuit and a gate connected to the output of the transient threshold voltage control circuit.

18. The voltage transient detector as recited in claim 17, wherein the sum of Zener voltages of Zener diodes between the node and the input of the transient threshold voltage control circuit does not exceed a voltage rating of the MOSFET.

19. The voltage transient detector as recited in claim 18, wherein the transient detection circuit includes a Zener diode having a cathode connected to the gate of the MOSFET and an anode connected to a source of the MOSFET, the Zener diode in the transient detection circuit configured to prevent over voltage damage to the MOSFET.

20. The voltage transient detector as recited in claim 1, further comprising:
a filter circuit having an input connected to the output of the transient threshold voltage control circuit, the filter circuit having an output connected to the input of the transient detection storage circuit.

21. The voltage transient detector as recited in claim 20, wherein the filter circuit includes a resistor connected between the input and the output of the filter circuit, and wherein the filter circuit includes a capacitor connected between the input and the output of the filter circuit.

22. The voltage transient detector as recited in claim 1, further comprising:
a rectifier circuit having a first input terminal, a second input terminal, a first output terminal, and a second output terminal, the first output terminal connected to the positive terminal of the voltage transient detector, the second output terminal connected to the negative terminal of the voltage transient detector, the first and second input terminals of the rectifier circuit connected to respective terminals of an alternating current voltage source that is to be monitored for voltage transients.

23. The voltage transient detector as recited in claim 22, wherein the rectifier circuit is a full wave diode bridge rectifier circuit.

* * * * *